United States Patent
Hayashi et al.

(10) Patent No.: US 6,270,002 B1
(45) Date of Patent: Aug. 7, 2001

(54) BALL ARRANGEMENT METHOD AND BALL ARRANGEMENT APPARATUS

(75) Inventors: Nobuaki Hayashi; Kouhei Katoh, both of Tokyo (JP)

(73) Assignee: Nippon Micrometal Co., Ltd., Saitama (JP)

(*) Notice: Subject to any disclaimer, the term of this patent is extended or adjusted under 35 U.S.C. 154(b) by 0 days.

(21) Appl. No.: 09/149,129

(22) Filed: Sep. 8, 1998

(30) Foreign Application Priority Data

| Sep. 10, 1997 | (JP) | 9-245284 |
| Apr. 28, 1998 | (JP) | 10-118770 |
| May 27, 1998 | (JP) | 10-145377 |

(51) Int. Cl.⁷ ............ B23K 35/12; B23K 20/12; B23K 20/14; B23K 1/19
(52) U.S. Cl. .............. 228/246; 228/2.1; 228/41; 228/254; 228/262.2
(58) Field of Search ............... 228/2.1, 262.6, 228/254, 246, 41; 144/142

(56) References Cited

U.S. PATENT DOCUMENTS

| 3,320,658 | * | 5/1967 | Bolda et al. | 29/155.5 |
| 5,118,027 | * | 6/1992 | Braun et al. | 228/180 |
| 5,431,332 | * | 7/1995 | Kirby et al. | 228/246 |
| 5,499,487 | | 3/1996 | McGill. | |
| 5,551,216 | | 9/1996 | McGill. | |
| 5,655,704 | * | 8/1997 | Sakemi et al. | 228/246 |
| 5,657,528 | * | 8/1997 | Sakemi et al. | 29/430 |
| 5,680,984 | * | 10/1997 | Sakemi | 228/246 |
| 5,687,901 | * | 11/1997 | Hoshiba et al. | 228/246 |
| 5,976,965 | * | 11/1999 | Takahashi et al. | 438/616 |

FOREIGN PATENT DOCUMENTS

| 6-224199 | 8/1994 | (JP). |
| 7-202403 | 8/1995 | (JP). |
| 8-8523 | 1/1996 | (JP). |
| 8-236527 | 9/1996 | (JP). |

* cited by examiner

Primary Examiner—Geoffrey S. Evans
Assistant Examiner—Zidia T. Pittman
(74) Attorney, Agent, or Firm—Wenderoth, Lind & Ponack, L.L.P.

(57) ABSTRACT

The present invention relates to a method and an apparatus for arranging fine balls serving as a ball bump particularly on electrodes on a semiconductor chip, electrodes on a semiconductor-mounting substrate, or electrodes on a semiconductor device. It is made possible to remove small-diameter balls by, firstly, using a pre-arrangement plate for arranging the balls and using two diameters for the ball trap holes of the pre-arrangement plate. Secondly, occurrence of a ball suction abnormality and the time required for sucking the balls is reduced by using the pre-arrangement plate and a ball feeder. Thirdly, a ball suction abnormality to the ball arrangement device is determined by detecting the air flow velocity in an evacuation route of the ball arrangement device.

46 Claims, 14 Drawing Sheets

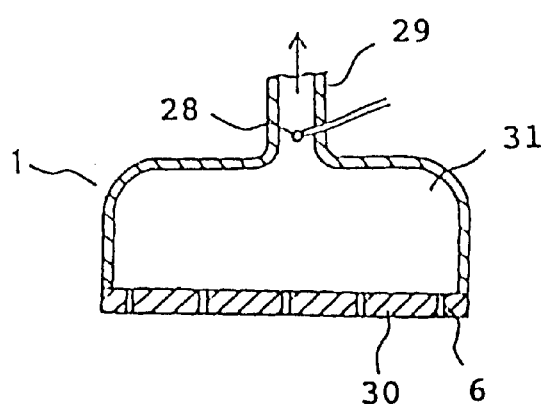
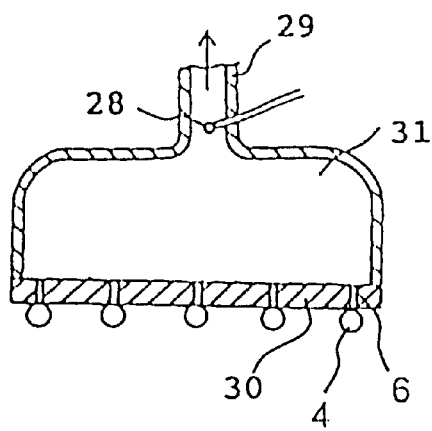
FIG. 16(a)
FIG. 16(b)

FIG. 17(a)
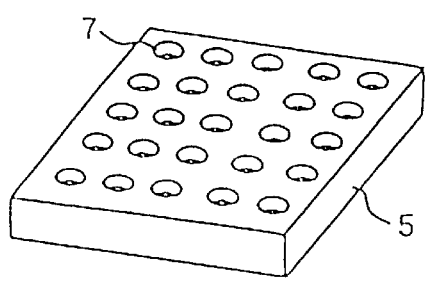
FIG. 17(b)
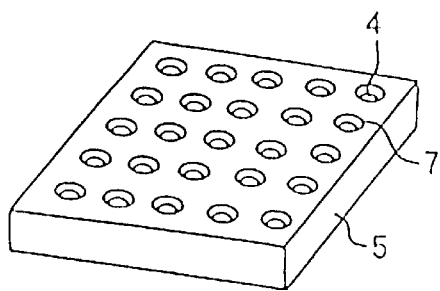
FIG. 17(d)
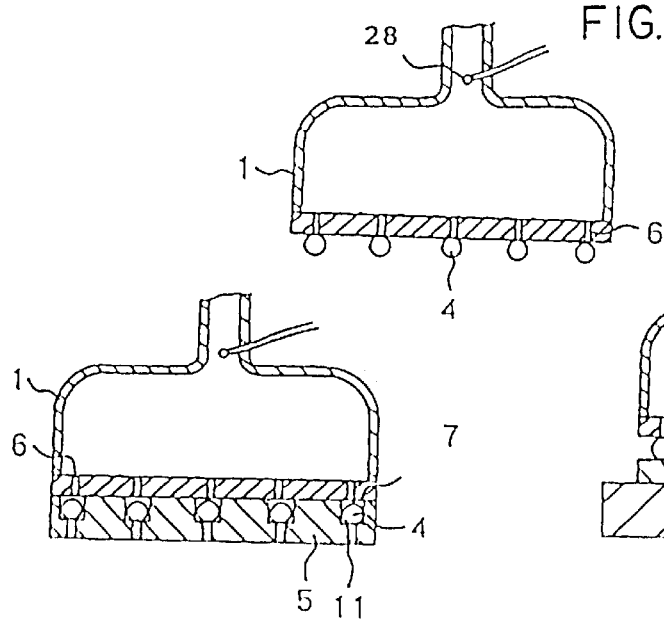
FIG. 17(e)
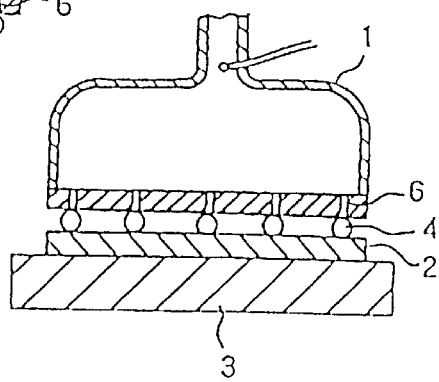
FIG. 17(c)

BALL ARRANGEMENT METHOD AND BALL ARRANGEMENT APPARATUS

BACKGROUND OF THE INVENTION

1. Field of the Invention

The present invention relates to a method and an apparatus for arranging balls on a mounting object. More particularly, the present invention relates to a method and an apparatus for arranging fine balls serving as ball bumps on an electrode on a semiconductor chip, an electrode on a semiconductor-mounting substrate, or on a semiconductor device electrode.

2. Description of the Related Art

Fine balls (bumps) are used as a medium for connecting an electrode on a semiconductor chip substrate and an external circuit. The technique of forming bumps for a ball grid array (BGA) by transferring fine balls onto a semiconductor substrate or a semiconductor chip is becoming more important. In this specification, a semiconductor chip for transferring balls and the like are collectively referred to as a mounting object.

The conventional technique for transferring balls onto a mounting object is as follows. A ball arrangement device has a ball suction holes pierced for sucking many balls. The positions of the ball suction holes correspond to positions at which the balls on a semiconductor chip or the like are to be transferred. All the balls are previously sucked in the suction holes, and the ball arrangement device is transferred to a mounting base. The mounting object onto which the balls are to be transferred is placed on the mounting base in advance. The balls can be transferred by pressing the balls sucked on the ball arrangement device onto the surface of the mounting object on the mounting base.

Along with the recent higher integration of semiconductor devices, there is an increasing number of electrodes for a single semiconductor. Usually, a semiconductor is provided with 100 to 300 electrodes, and more recently, a single semiconductor device has even 500 to 1,000 electrodes. As a result, the area of a semiconductor tends to increase, and the size of a ball is becoming smaller, and at the same time, there is a tendency of the arrangement interval between balls toward a narrower value. Furthermore, in the aforementioned technique of transferring the balls as a bump, it is becoming a common practice not only to transfer the balls in a number equal to that of electrodes for a semiconductor in a lump, but also to mount balls in a lump on a plurality of chips, thereby improving productivity.

In the above-mentioned conventional technique, many fine balls having a uniform size are provided in a tray. The surface sucking the balls of the ball arrangement device is brought closer to the fine balls in the tray. The ball suction holes are caused to suck the fine balls by sucking air through reduction of pressure on the back of the ball suction holes (FIG. 18). Suction can more easily be accomplished by vibrating the tray upon suction to cause the ball to jump in the tray, or by causing the balls to float in the tray by air blow through the bottom of the tray.

The fine balls fed into the tray may contain balls having a diameter off the standard upper limit or off the standard lower limit mixed therein although in a slight amount. While balls having a larger diameter off the standard upper limit can easily be excluded in the manufacturing stage of balls, exclusion of balls having a smaller diameter off the standard lower limit may sometimes be insufficient. In the conventional ball arrangement apparatus, which does not have a function of excluding defective balls having a diameter smaller than the standard lower limit, mixture of defective balls would result in mounting of balls of an insufficient diameter on a product such as a ball grid array. When using solder balls, it is the usual practice to preliminarily attach the solder balls to the mounting object with bonding power of flux. small diameter of solder balls results in occurrence of such defects as some of solder balls left uncoated with flux or solder balls not coming into contact with the electrodes. When using gold balls, means for thermally pressing the gold ball against the object is employed. Gold balls having a small diameter lead to a defect in that sufficient pressing is unavailable, making it impossible to obtain pressure contact.

Because of feeding balls in a large quantity to the tray to cause the balls to jump therein, and as required to vibrate the tray, dust and dirt are inevitably entangled into the tray from surroundings. Since dirt and dust are mixed with the balls in a large quantity in the tray, it is impossible to remove them. If dust is sucked into the ball suction hole of the ball arrangement device in place of the balls, arrangement of the balls ends in failure.

In order to remove balls in excess adhering to the ball arrangement device, there are proposed a method for excluding balls in excess with an air blow or a brush after suction of the balls, and a method, disclosed in Japanese Unexamined Patent Publication No. 8-64,944(U.S. Pat. No. 5,657, 528), of causing relative displacement of the ball arrangement device and the tray of the balls.

It has been the conventional practice to adopt a diameter of the ball suction hole of the ball arrangement device about 0.5 times as large as the diameter of the balls to e sucked. With a larger diameter of the ball suction hole, the balls cut into the ball suction holes under the pressure applied upon transfer of the balls onto the mounting object. When transferring gold balls requiring adoption of thermal pressure-contact, pressure is high, and when transferring solder balls, not requiring a high transferring pressure, the solder balls are susceptible easy deformation: it is therefore necessary to use a smaller diameter of the ball suction holes to prevent cut-in of the balls in all cases. As the sucking force of the ball is proportional to the cross-sectional area of the suction hole, a smaller diameter of the suction hole inevitably leads to a smaller sucking force.

When using solder balls, flux is usually transferred to the position of transfer on the mounting object or to the solder balls prior to transferring the balls to the mounting object. Transfer carried out without taking notice of adherence of excessive balls may a trouble of the flux adhering via the balls to the ball arrangement device. This not only results in a single defective semiconductor device to which excessive balls have been transferred, but also makes it impossible to start the next operation unless the ball arrangement device having the flux adhering thereto is washed, thus causing a serious decrease in equipment productivity. It is therefore necessary to prevent occurrence of an abnormality of adhering balls in excess.

A first object of the present invention is to exclude balls of a small diameter off the standard lower limit and entangled dust and dirt before sucking the balls into the ball arrangement device, thereby preventing failure of arrangement of the balls.

In the conventional method of sucking the balls jumping or floating in the ball tray into the ball suction holes of the ball arrangement device, each ball sucking hole must suck one ball. However, a plurality of balls may be sucked into a single ball suction hole, or balls may adhere to a portion other than the ball suction hole on the ball arrangement device, or there may be some ball suction holes not sucking the balls.

An attracting force may act between a ball and the ball arrangement device, so that a ball may be attracted at a portion other than the portions where vacuum attracted acts as at the ball suction holes. In order to exclude these excessive balls by means of an air blow or a brush, it is necessary to impart a force of a prescribed magnitude to these balls in excess. On the other hand, the suction force of the balls to the ball suction holes is proportional to the cross-sectional area of the suction hole and the suction pressure. Because the diameter of the ball suction hole is only about 0.5 times as large as the diameter of the ball as described above, the sucking force of the ball to the suction hole is not sufficient. If an air blow or brush cleaning with a force sufficient to exclude the excessive balls, therefore, even balls having been sucked properly in the ball suction holes are excluded.

Under the aforementioned circumstances, in the conventional ball arrangement method in which the occurring ratio of adhering abnormality of excessive balls is high, and the detecting ability of adhering abnormality of excessive balls is not sufficient, it has been difficult to eliminate a trouble in which an abnormality was not detected by detecting means and balls were transferred as they were onto the mounting object.

In the conventional method of sucking balls jumping or floating in the tray into the ball suction holes of the ball arrangement device, a problem has been encountered in which suction of many balls in a lump took a very long period of time before completion of suction into all the ball suction holes. Particularly, when sucking 1,000 or more balls, suction has required a long time of from 8 to 15 seconds.

A second object of the present invention is to provide ball arrangement method and apparatus which permits prevention of occurrence of a suction abnormality such as an excessive suction or insufficient suction, and reduction of time for suction of balls.

It is possible to effect normal transfer of balls onto the mounting object by sucking one ball into each of all the ball suction holes of the ball arrangement device. Transfer of the balls onto the mounting object while some suction holes do not contain sucked balls results in a defective mounting object such as a semiconductor chip because of shortage of balls. After suction of the balls into the ball suction holes of the ball arrangement device, therefore, it is the usual practice to conduct an inspection to discover a ball suction abnormality prior to transferring the balls onto the mounting object. The inspection is generally carried out by the use of optical detecting means. For example, generally known methods include a method of observing from front of the ball arrangement device by means of an ITV; and a method of detecting the presence of a light passing through the ball suction holes as disclosed in Japanese Unexamined Patent Publication No. 8-153,960(U.S. Pat. No. 5,601,229). When a ball suction abnormality is discovered in the inspection, the balls are not transferred onto the mounting object, but suction to the ball arrangement device is tried again, thereby preventing occurrence of a trouble in which a defective semiconductor chip which is the mounting object results.

When carrying out an inspection for discovering a ball suction abnormality by the method using an ITV, it is necessary to pick up an image of a condition of suction with an image pick-up apparatus, process the thus taken image by an image processor, and further, provide detecting means for determining the presence of a ball suction abnormality from the processed image. Upon shooting the image, presence of individual balls must be recorded within the range of resolution of the shooting apparatus. Because there is a tendency of the area for mounting in a lump becoming larger, the size of the ball becoming smaller, and the interval between arranged balls becoming smaller, it may sometimes be impossible to shoot and inspect the area for arrangement in a lump at a time. In such a case, a considerably increased inspection time results in a longer tact time of ball arrangement, after causing impairment of productivity. Another problem is that it is necessary to provide a shooting apparatus, an image processor and determining and detecting means, leading to an increase in the inspection equipment cost. The position of ball arrangement and the member of balls are basically different for each kind of mounting object, and it is necessary to individually build suction abnormality determining/detecting means for each kind.

In the method of detecting the presence of a light passing through the ball suction holes, it is necessary to detect a leakage light by gathering beams from passing light channels in a number equal to the member of balls to be sucked. This results in a problem of the inner structure of the ball arrangement device becoming larger in scale, which in turn leads to a lower operating speed of the apparatus and an increase in manufacturing cost.

A third object of the present invention is to provide ball arrangement method and apparatus having detecting means which permits detection of a ball suction abnormality without fail in a simple manner.

SUMMARY OF THE INVENTION

For achieving the first object, the present invention has the following features.

The present invention provides a ball arrangement method comprising the steps of: pre-arranging balls 4 in trap holes 7 of a pre-arrangement plate 5; the trap hole being a hole for trapping a ball; the trap holes being at positions corresponding to the positions of ball suction holes 6 of a ball arrangement device 1; and the shape of the trap holes being such that the sectional shape of an open end 37 thereof permits passage of a ball 4 having the largest diameter and an inner end 38 thereof has such a shape that a ball having a diameter larger than the smallest allowable diameter cannot pass there through and balls having a diameter smaller than the smallest diameter can pass there through;

sucking balls pre-arranged on the pre-arrangement plate to ball suction holes 6 of the ball arrangement device 1; and transferring the sucked balls onto a ball mounting object 2, thereby mounting the balls 4 in a lump onto the ball mounting object 2.

Upon pre-arranging the balls 4 on the pre-arrangement plate 5, the balls may be sucked by reducing pressure on a side opposite to the open end of the ball trap holes 7 of the pre-arrangement plate. Upon pre-arranging the balls on the pre-arrangement plate 5, the pre-arrangement plate may be vibrated. Upon pre-arranging the balls on the pre-arrangement plate 5, an air blow may be sprayed onto the surface of the pre-arrangement plate.

The invention further provides a ball arrangement apparatus comprising: a pre-arrangement plate 5 having trap holes 7 for pre-arranging balls 4; the trap holes being at positions corresponding to positions of ball suction holes 6 of a ball arrangement device 1; and the shape of the trap holes being such that the sectional shape of an open end 37 thereof permits passage of a ball having the largest diameter and an inner end thereof has such a shape that a ball having a diameter larger than the smallest allowable diameter cannot pass there through and balls having a diameter smaller than the smallest diameter can pass there through;

a ball arrangement device 1 having ball suction holes arranged thereon so as to suck the balls pre-arranged in the trap holes of the pre-arrangement plate; and a mounting base 3 for mounting a mounting object so as to mount the balls sucked in the ball suction holes of the ball arrangement device 1 onto the mounting object 2.

The inner end of the trap hole of the pre-arrangement plate may have a rectangular sectional shape. The trap hole of the pre-arrangement plate may be tapered so as to have a cross-section converging from the open end toward the inner end thereof. The trap hole of the pre-arrangement plate may have suction means for sucking a ball by reducing the pressure in the trap hole from behind. There may be provided vibration means for vibrating the pre-arrangement plate on which the balls are pre-arranged. There may be provided means for spraying an air flow onto the surface of the pre-arrangement plate on which the balls are pre-arranged.

According to the invention, the balls 4 are pre-arranged in the trap holes 7 of the pre-arrangement plate 5 prior to sucking the balls 4 into the ball suction holes 6 of the ball arrangement device 1. Balls having a diameter smaller than the standard lower limit and fine dirt and dust drop down on the side opposite to the open end through the trap holes. Small-diameter balls and fine dirt and dust are therefore not sucked by the ball arrangement device.

Further, in the invention, clogging of the trap holes by the balls can be inhibited by adopting a rectangular cross-sectional shape of the inner end of the ball trap hole of the pre-arrangement plate, as compared with a circular cross-sectional shape thereof. A rectangular cross-sectional shape ensures easy passage of the ball. Reduction of pressure in the trap holes upon pre-arranging the balls on the pre-arrangement plate can further facilitate passage of small-diameter balls and dirt and dust.

In the invention, furthermore, a ball is certainly trapped in each trap hole by vibrating the pre-arrangement plate upon pre-arranging the balls on the pre-arrangement plate. Blowing air flow onto the surface of the pre-arrangement plate permits removal of balls in excess when such excessive balls are held on the pre-arrangement plate.

To achieve the second object of the invention, the invention provides the following features.

The invention provides a ball arrangement method comprising the steps of:

arranging a pre-arrangement plate 5 having trap holes 7 for trapping balls 4 with the surface thereof trapping the balls directed upward; the trap holes being arranged at positions corresponding to ball suction holes 6 of a ball arrangement device 1;

pre-arranging the balls in the trap holes of the pre-arrangement plate by transversely moving a ball feeder 8 which continuously feeding the balls from the ball feeder 8 to the pre-arrangement plate; and the ball feeder continuously feeding the balls through a ball feeding port;

then, sucking the balls pre-arranged on the pre-arrangement plate to the ball suction holes of the ball arrangement device; and transferring the sucked balls onto a mounting object 2, thereby mounting the balls onto the mounting object (FIG. 9).

In the ball arrangement method of the invention, the interval between the lower end of the ball feeding port of the ball feeder 8 and the pre-arrangement plate may be set to 1.2 to 5.0 times as large as the diameter of the ball, and the ball may be pre-arranged in the trap holes on the pre-arrangement plate by transversely moving of the ball feeder while continuously feeding the balls. The balls in excess may be swept out from the pre-arrangement plate by means of a gas flow from a nozzle 10 moving on the pre-arrangement plate (FIG. 10). The trap hole of the pre-arrangement plate should preferably have a diameter larger than the diameter of the ball and smaller than 1.6 times the diameter of the ball; the trap hole should preferably have such a depth that the top of the ball trapped in the trap hole is at a deeper position than the surface of the pre-arrangement plate; and said top should preferably be at a depth up to 0.4 times the diameter of the ball from the surface of the pre-arrangement plate.

In the ball arrangement method of the invention, there may be provided through holes 11 having a diameter smaller than the diameter of the ball on the bottom surface of the trap holes 7 of the pre-arrangement plate 5. Upon pre-arranging the balls in the trap holes by feeding the balls onto the pre-arrangement plate by the ball feeder 8, and/or sweeping out balls in excess from the pre-arrangement plate by means of a gas flow, the balls held in the trap holes may be sucked by evacuation of the through holes 11 on the bottom surface of the trap holes 7 of pre-arrangement plate (FIG. 12).

In the ball arrangement method of the invention, the balls may be fed onto the pre-arrangement plate by sucking the balls from the suction side 16 of a vacuum ejector 15, and distributing the balls to the ball feeder 8 by arranging the exhaust side 17 of the vacuum ejector to the ball feeder (FIG. 13).

In the ball arrangement method of the invention, there may be provided channels 13 for collecting balls in excess swept out from the pre-arrangement plate on at least two sides of the pre-arrangement plate 5. The balls may be fed onto the pre-arrangement plate by inclining the channels 13 for collecting the balls, causing the balls to drop by gravity into a reservoir 14 for storing the balls, sucking the balls stored in the reservoir from the suction side of the vacuum ejector, and arranging the exhaust side of the vacuum ejector on the ball feeder, thereby distributing the balls to the ball feeder (FIG. 13).

In the ball arrangement method of the invention, upon sucking the balls pre-arranged on the pre-arrangement plate to ball suction holes of the ball arrangement device, the ball arrangement device 1 may be brought into close contact with the pre-arrangement plate 5 (FIG. 15). Upon sucking the balls pre-arranged in the trap holes of the pre-arrangement plate to the ball suction holes of the ball arrangement device, a positive pressure should preferably be applied to the through holes of the pre-arrangement plate. Upon applying the positive pressure, ions should preferably be supplied to a positive pressure gas fed to the through holes by means of an ionizer 20 (FIG. 14)

In the ball arrangement method of the invention, a plastic pre-arrangement plate may be used. More preferably, a conductive plastic pre-arrangement plate may be used. Further, a pre-arrangement plate made of plastics having a Rockwell hardness of at least 110-M should preferably used.

In the ball arrangement method of the invention, the through hole has a sectional shape permitting passage therethrough of a small-diameter off-standard ball, and small-diameter off-standard balls can thus be excluded from the pre-arrangement plate through the through holes.

Further, the invention provides a ball arrangement apparatus comprising:

a pre-arrangement plate 5, a ball feeder 8, a ball arrangement device 1 and a mounting base 2;

wherein the pre-arrangement plate has trap holes 7 for trapping the balls at positions corresponding to ball suction holes 6 of the ball arrangement device;

the ball feeder continuously feeds the balls through a ball feeding port while displacing transversely on the pre-arrangement plate;

the ball arrangement device sucks the balls pre-arranged in the trap holes of the pre-arrangement plate; and the mounting base is a base for mounting a mounting object for transferring the balls sucked by the ball suction holes of the ball arrangement device onto the mounting object.

In the ball arrangement apparatus of the invention, upon transverse displacement of the ball feeder on the pre-arrangement plate, the interval between the lower end of the ball feeding port of the ball feeder and the pre-arrangement plate may be 1.2 to 5.0 times as large as the diameter of the ball. There may be provided a nozzle blowing a gas while moving on the pre-arrangement plate for sweeping out balls in excess from the pre-arrangement plate.

In the ball arrangement apparatus of the invention, the trap hole of the pre-arrangement may have a diameter larger than the diameter of the ball and smaller than 1.6 times the diameter of the ball; the trap hole may have such a depth that the top of the ball held by the trap hole is at a position deeper than the surface of the pre-arrangement plate; and the top may be at a depth of up to 0.4 times the diameter of the ball from the surface of the pre-arrangement plate. The bottom surface of the trap hole of the pre-arrangement plate should preferably be provided with through holes having a diameter smaller than the diameter of the ball. Further, there should preferably be provided suction means for sucking the balls through through holes from behind the pre-arrangement plate.

In the ball arrangement apparatus of the invention, there may be provided a vacuum ejector 15 for transferring the balls, of which the evacuation side 16 is arranged on the ball storage reservoir 14 and the exhaust side 17 is arranged on the ball feeder 8.

In the ball arrangement apparatus of the invention, channels 13 for collecting balls in excess swept out from the pre-arrangement plate may be provided on at least two sides of the pre-arrangement plate. There may be provided inclined channels for collecting the balls a reservoir 14 for storing the balls received from the channels, and a vacuum ejector 15 for transferring the balls; and the evacuation side 16 of the vacuum ejector may be arranged on the ball storage reservoir 14 and the exhaust side 17 thereof may be arranged on the ball feeder 8.

In the ball arrangement apparatus of the invention, upon sucking the balls pre-arranged on the pre-arrangement plate to the ball suction holes of the ball arrangement device, the ball arrangement device can be brought into close-contact with the pre-arrangement plate.

In the ball arrangement apparatus of the invention, there may be provided means for imparting a positive pressure to the trap holes from behind the pre-arrangement plate through the through holes of the pre-arrangement plate. There may be provided an ionizer 20 for adding ions to a gas under a positive pressure fed to the through holes upon imparting the positive pressure.

In the ball arrangement apparatus of the invention, the pre-arrangement plate is made of plastics, or preferably conductive plastics, or more preferably plastics having a Rockwell hardness of at least 110-M.

In the ball arrangement apparatus of the invention, the through hole has a sectional shape permitting passage of small-diameter off-standard balls.

The present invention is characterized in that the balls 4 are not arranged by sucking the balls directly in the ball suction holes 6 of the ball arrangement device 1, but the balls are pre-arranged in trap holes 7 of the pre-arrangement plate 5, and then sucked again to the ball arrangement device 1.

In the conventional ball arrangement method, the ball arrangement device 1 has a function of sucking the balls and a function of transferring the balls onto the mounting object 2. The shape of the portion surrounding the ball suction holes is therefore constrained by the function necessary in transfer. When using the pre-arrangement plate 5 of the invention, on the other hand, the ball holding portion of the pre-arrangement plate has such a shape that the portion to hold a ball hold on ball without fail and it is thus possible to select an optimum shape for causing the other portions not to hold a ball. More specifically, a trap hole is provided at the ball holding portion, and the trap hole has a shape ensuring holding of a ball. Even when applying a strong air blow or sweeping with a brush for excluding balls adhering in excess onto the pre-arrangement plate, a ball normally held in the trap hole is not swept out, only balls in excess can be excluded certainly.

In the arrangement of the balls using the pre-arrangement plate of the invention, occurrence of adherence of balls in excess can be eliminated almost completely, although there are a few cases of ball lack, i.e. when a ball is not sucked at the position at which it is to be sucked. As a result, an advantage is available in that the frequency of overlooking an abnormality in the inspection is remarkably reduced even with commonly used inspection means. Because there is no occurrence of balls, it is possible to prevent a decrease in productivity resulting from adherence of flux to the ball arrangement device even when transferring solder balls by coating a flux.

The second feature of the invention lies in that the pre-arrangement plate 5 is arranged with the surface thereof holding the ball directed upward, and the balls are pre-arranged in the trap holes of the pre-arrangement plate by transversely moving the ball feeder while continuously feeding the balls from the ball feeder 8 for continuous feeding of the balls 4 through the ball feeding port 9 onto the pre-arrangement plate 5.

It is thus possible to continuously feed the balls in a large quantity through the ball feeding port from above the pre-arrangement plate. By transversely moving the ball feeder while continuously feeding the balls, it is possible to feed the balls to all the trap holes on the pre-arrangement plate in a short period of time. When the longitudinal width of cross-section of the ball feeding port is comparable with the width for arrangement of the balls on the pre-arrangement plate, feeding of the balls to all the trap holes on the pre-arrangement plate can be completed in a single run of transverse displacement by causing the ball feeder to move transversely in a direction at right angles to the ball feeding port.

For achieving the third object of the invention, feature of the invention are as follows.

The present invention provides a ball arrangement method comprising the steps of sucking balls in ball suction holes of a ball arrangement device provided with the ball suction holes, and transferring the sucked ball group onto a mounting object, thereby mounting the balls in a lump on the mounting object; wherein suction of the balls in all the ball suction holes of the ball arrangement device is determined by detecting the flow velocity of air in an evacuation route on the back of the ball suction holes of the ball arrangement device. The air flow velocity should preferably be detected by means of a hot wire anemometer.

The present invention further provides a ball arrangement apparatus for sucking balls 4 in ball suction holes 6 of a ball arrangement device 1 provided with the ball suction holes, and then, transferring the sucked ball group onto a mounting object 2, thereby mounting the balls in a lump onto the mounting object, comprising the ball arrangement device 1 having the ball suction holes on the surface thereof and an evacuation route on the back of the ball suction holes, means for detecting the flow velocity of air in the evacuation route, and mounting base 3 for mounting the mounting object 2 for transferring the balls sucked in the ball suction holes of the ball arrangement device onto the mounting object (FIG. 17). The means for detecting the flow velocity of air should preferably a hot wire anemometer 28.

In the ball arrangement apparatus of the invention, the ball suction holes 6 are through holes provided in a flat plate 30, a closed room 31 being provided on the back of the flat plate having the through holes, and the balls are sucked into the ball suction holes by vacuum-evacuating via the evacuation route 29 provided in the closed room. When the balls are normally sucked into all the ball suction holes, air flow into the closed room is completely cut off, thus leading to the lowest flow velocity of air through the evacuation route. In contrast, when even a single ball suction hole not having a ball adhering thereto, air flows into the closed room through this ball suction hole, thus resulting in an increase in the flow velocity of air flowing through the evacuation route as compared with the case of normal suction. The present invention is characterized in that detection of a ball suction abnormality is made possible by the utilization of this phenomenon. That is, the fact that all the ball suction holes of the ball arrangement device have sucked the balls is determined by detecting the flow velocity of air through the evacuation route on the back of the ball suction holes of the ball arrangement device.

Irrespective of whether a ball suction abnormality is present or absent, the flow rate of air through the evacuation route presents a very low value. It is possible to measure at a high accuracy this low flow velocity of air by detecting it by means of a hot wire anemometer, thus permitting stable determination of the presence of a ball suction abnormality.

BRIEF DESCRIPTION OF THE DRAWINGS

FIG. 2 covers sectional views illustrating steps of sucking balls pre-arranged on the pre-arrangement plate to a ball arrangement device and transferring then onto a mounting object;

FIG. 4 covers sectional views illustrating another embodiment of the pre-arrangement plate of the invention;

FIG. 5 covers view illustrating an embodiment of the pre-arrangement plate of the invention;

FIGS. 6 and 7 cover views illustrating another embodiment of the pre-arrangement plate of the invention;

FIG. 8 cover views illustrating pre-arrangement in the invention;

FIG. 9 covers schematic view illustrating the ball arrangement method and apparatus of the invention;

FIG. 15 covers sectional views illustrating the ball arrangement device brought into close contact with the pre-arrangement plate upon sucking the balls from the trap hoes to the ball suction holes;

FIG. 16 covers sectional views illustrating the ball arrangement device of the ball arrangement apparatus of the invention;

FIG. 16A is a sectional view of the state before suction of the balls; and

FIG. 16B is a sectional view of the state after suction of the balls;

FIG. 17 covers perspective and sectional views illustrating arrangement of the balls on the ball arrangement device by means of the pre-arrangement plate in an embodiment;

FIG. 17A is a perspective view illustrating the pre-arrangement plate;

FIG. 17B is a perspective view illustrating the pre-arrangement in which the balls are pre-arranged;

FIG. 17C is a sectional view illustrating suction of the balls from the pre-arrangement plate onto the ball arrangement device;

FIG. 17D is a sectional view illustrating the ball arrangement device having the sucked balls; and FIG. 17E is a sectional view illustrating transfer of the balls from the ball arrangement device to the mounting object.

DESCRIPTION OF THE PREFERRED EMBODIMENTS

Preferred embodiments for application of the invention to achieve the first object will now be described.

First, an embodiment will be described with reference to FIGS. 1 and 2. While there is no restriction on the kind and size of ball 4, a fine metal ball such as a gold ball serving as a bump as a connecting medium between electrodes of semiconductor chip and a circuit board, or a solder ball serving as a bump for a ball grid array, having a diameter within a range of from 0.04 to 0.80 mm is particularly effective.

Figure 1:
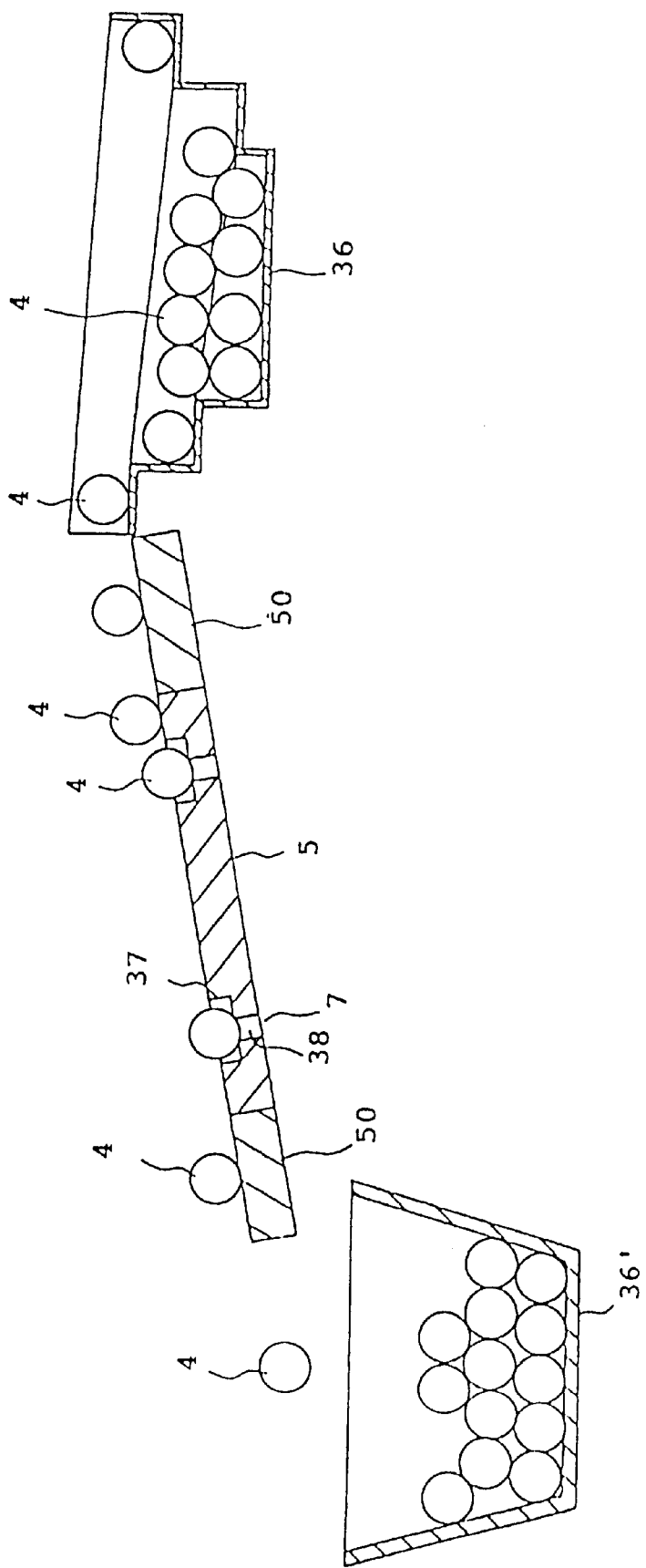
FIG. 1 is a sectional view illustrating pre-arrangement of balls on the pre-arrangement plate of the present invention.

In FIG. 1, trap holes 7 are arranged on a pre-arrangement plate 5, and the trap holes 7 run through the pre-arrangement plate. The positions of the trap holes 7 on the pre-arrangement plate correspond to the positions on a mounting object 3 at which the balls are to be arranged. The shape of the trap hole 7 is as follows. The sectional shape of an open end side 37 permits passage of a ball having a diameter larger than the standard upper limit diameter (the largest diameter) of the ball 4, and an inner end side 38 of the trap hole has such a shape that a ball having a diameter larger than the standard lower limit diameter (the smallest diameter) of the ball cannot pass through, and balls having a smaller diameter can pass therethrough. The trap hole 7 may have two steps of sectional shape. In this case, the depth of the portion having the sectional shape of the open end side 37 should be suitable for holding the ball 4 at this portion, usually about a half the diameter of the ball 4.

The pre-arrangement plate 5 forms, together with an inclined plate 50, a gentle slope. The appropriate inclination angle is within a range of from 2 to 15°. A tray 36 containing the balls 4 is arranged at the upper end of the inclined plate 50, and the balls 4 are sequentially fed onto the inclined plate 50 by a ball feeder not shown. Use of a parts feeder as ball feeding means is most suitable.

The balls fed from the tray 36 and rolling down on the inclined plate 50 ball halfway into the trap holes 7 of the pre-arrangement plate 5. The balls 4 having a normal diameter larger than the standard lower limit are held in the trap holes 7. Off-standard balls having a diameter smaller than the standard lower limit pass through the portion having the sectional shape of the inner end side 38 of the trap holes 7, and drop out below the pre-arrangement plate 5. Therefore, only those balls 4 having a normal diameter are held in the trap holes 7. Balls 4 in excess not held in the trap holes 7 slip down on the inclined plate 50 and are housed in a reservoir 36' provided below. The balls 4 housed in the resrvor 36' can be sent back to the upper tray 36 by means of a parts feeder not shown. The off-standard small-diameter balls having dropped down below the pre-arrangement plate 5 after passing through the trap holes are collected as off-standard products.

Figure 2A:
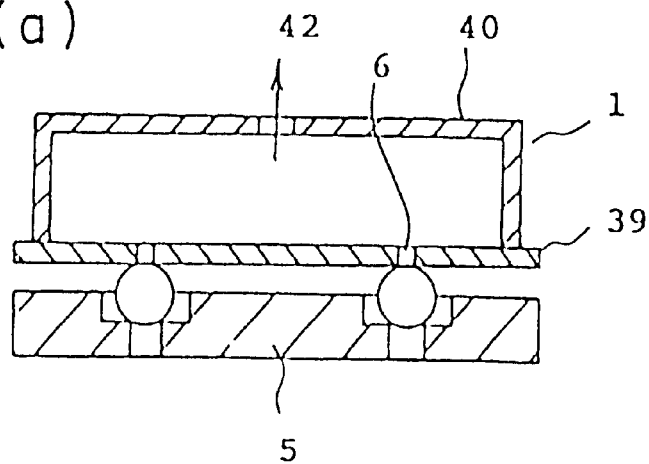
FIG. 2A is a sectional view illustrating the ball arrangement device brought into contact with the pre-arrangement plate having pre-arranged balls.
Figure 2B:
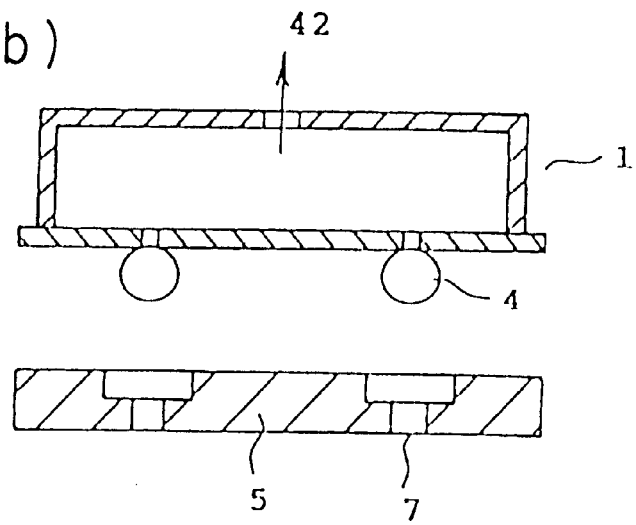
FIG. 2B illustrates the balls as sucked to the ball arrangement device.
Figure 2C:
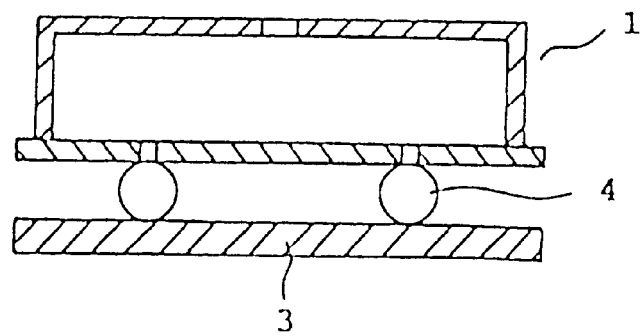
FIG. 2C illustrates transfer of the balls sucked to the ball arrangement device by pressing the balls against the mounting object.

After the lapse of a sufficient period of time, when the balls 4 are held in all the trap holes 7 of the pre-arrangement plate 5, feeding of the balls 4 is discontinued. In an embodiment for feeding solder balls, the appropriate feeding time is for about four seconds. After stoppage of feeding, the surface is kept horizontal by changing the angle of the pre-arrangement plate. Then, as shown in FIG. 2A, the ball arrangement device 1 is moved to face the pre-arrangement plate. Arrangement at this point should be such that the ball suction holes 6 of the ball arrangement device 1 can suck the corresponding balls 4 on the pre-arrangement plate. Then, to suck the balls, evacuation 42 is carried out for reducing pressure in the suction holes. This is usually performed by connecting a vacuum pump not shown to a head 40 of the ball arrangement device. Then, the pre-arrangement plate 5 is separated from the ball arrangement device 1 while continuing evacuation 42 (FIG. 2B). Further, as shown in FIG. 2C, the balls held by suction by the ball arrangement device 1 are caused to face the mounting object 3 to transfer the balls 4 onto the mounting object 3. When solder balls are used, a flux is printed in advance at positions to which the balls are to be transferred on the surface of the mounting object 3. The ball arrangement device 1 is lowered to the position of the mounting object 3 and the solder balls are lightly pressed against the mounting object. Then, when the vacuum system of the ball arrangement device 1 is released and the ball arrangement device 1 is lifted, the balls 4 are held on the mounting object 3 under the effect of adhering force of the flux.

Figure 3:
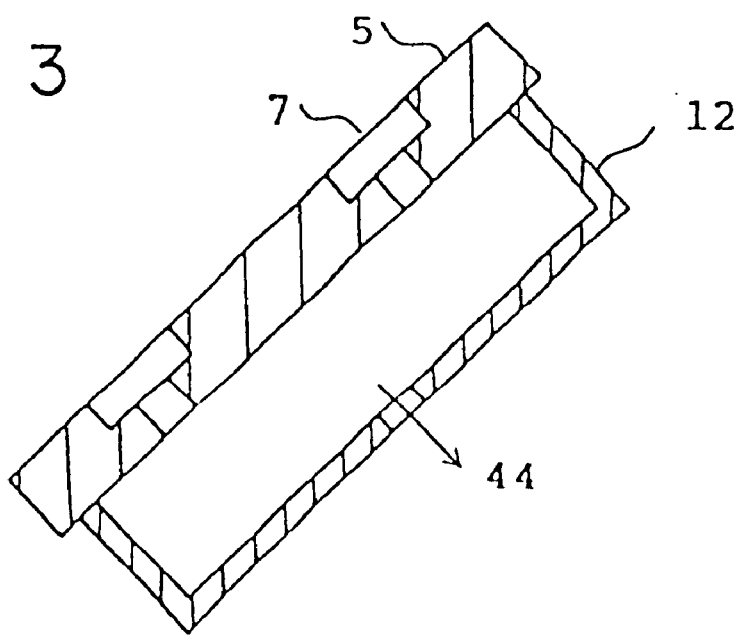
FIG. 3 is a sectional view illustrating an embodiment of the pre-arrangement plate of the invention.

A pre-arrangement plate head 12 may be provided on the back of the pre-arrangement plate 5 as shown in FIG. 3 and the pressure in the trap holes 7 may be reduced by sucking 44 the back upon holding the balls 4. This ensures holding of the balls 4, and at the same time, facilitates passage of off-standard small-diameter balls and dust, thus making it possible to exclude off-standard small-diameter balls and dust.

Figure 4A:
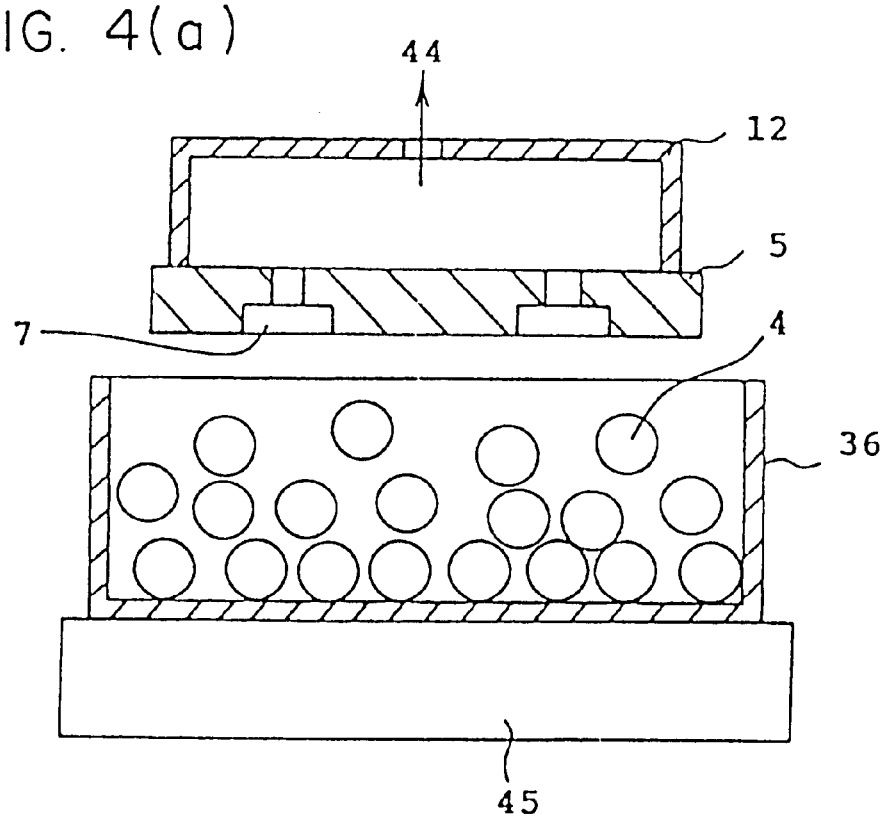
FIG. 4A is a sectional view illustrating suction of the balls to the pre-arrangement plate.
Figure 4B:
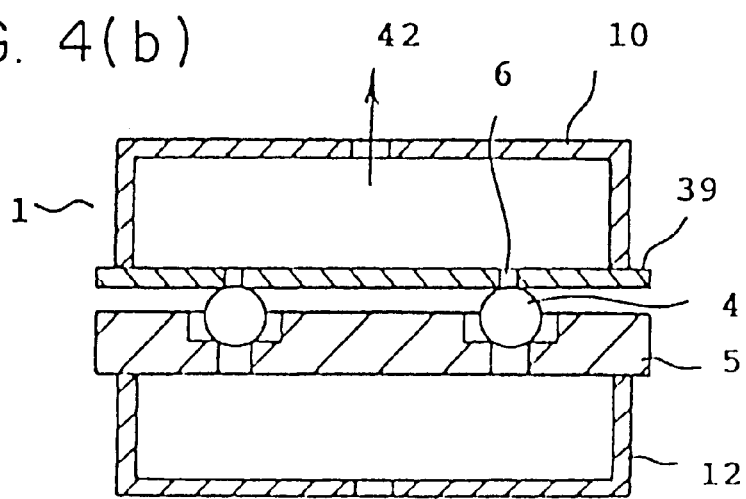
FIG. 4B is a sectional view illustrating suction of the pre-arranged balls to the ball arrangement device.

The balls 4 may be held in the trap holes 7 of the pre-arrangement plate 5 as shown in FIG. 4 by the use of the pre-arrangement plate 5 having a suction mechanism similar to that shown in FIG. 3. In this method, the balls 4 are held in a tray 36 as shown in FIG. 4A, and the balls 4 are caused to jump in the tray 36 by vibrating the tray 36 by a vibrator 45 connected to the tray 36. Then, the open end of the pre-arrangement plate 5 is directed downward into the tray 36, and the balls 4 can be sucked into the trap holes 7 by suction 44. In this case also, off-standard small-diameter balls and dust are sucked through the trap holes 7 into the pre-arrangement plate head 12. Then the pre-arrangement plate 5 is reversed so as to face the ball arrangement device 1 as shown in FIG. 4B. At the same time as the start of suction 42 of the ball arrangement device 1, suction of the pre-arrangement plate 5 is discontinued, and the balls 4 are held by suction in the ball suction holes 6 of the ball arrangement device 1. Subsequently, the balls are arranged through the same steps as shown in FIG. 2.

When a suction mechanism is provided on the back of the pre-arrangement plate 5 as shown in FIGS. 3 and 4, upon moving the balls 4 from the pre-arrangement plate 5 to the ball arrangement device 1, the interior of the head 12 of the pre-arrangement plate 5 may be pressurized. When the balls has a diameter, though within an acceptable range, closest to the off-standard small diameter, the ball 4 may sometimes cut into the inner end 38 of the trap hole 7. The balls 4 thus cutting into the trap holes 7 may be released by pressurizing the interior of the head 12.

Figure 5A:
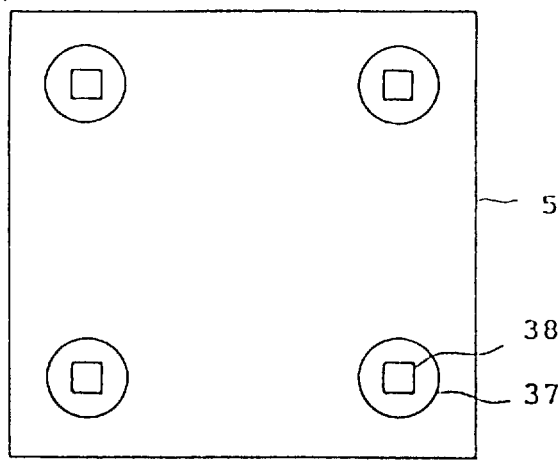
FIG. 5A is a front view.
Figure 5B:
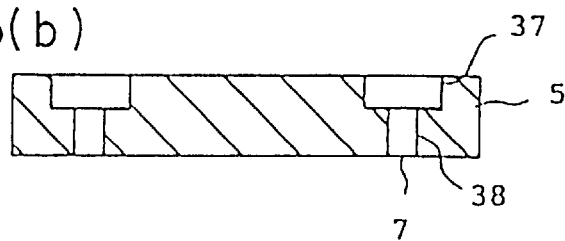
FIG. 5B is a sectional view.
Figure 6A:
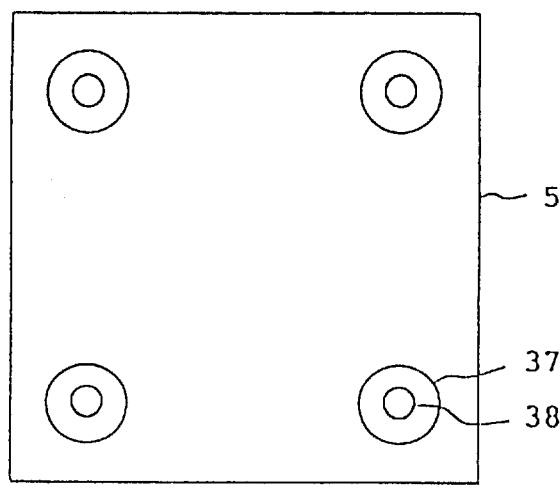
FIGS. 6A and 7A is a front view.
Figure 6B:
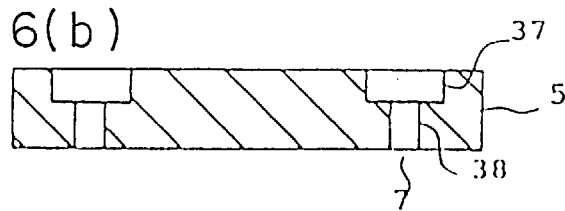
FIGS. 6B and 7B is a sectional view, respectively.
Figure 7A:
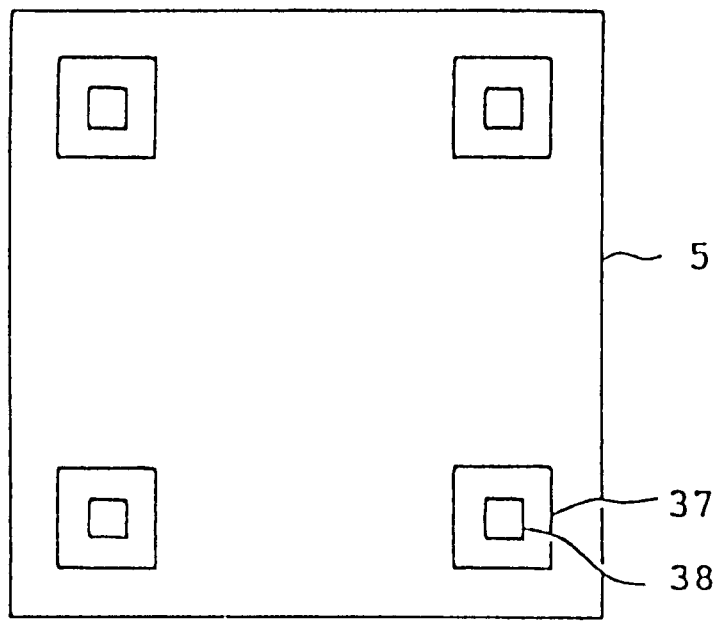

The cross-sectional shapes of the trap hole 7 of the pre-arrangement plate 5 are illustrated in FIGS. 5 to 7. only four trap holes are drawn in any of these drawings, but the actual number of trap holes is not limited to four. In the case of ball bump arrangement in a semiconductor substrate, for example, several hundred trap holes are provided on the pre-arrangement plate in checkers.

The open end side 37 of the trap hole 7 may have any cross-sectional shape so far as passage of balls having a diameter of the standard upper limit is permitted. Usually, a circular or rectangular cross-sectional shape is adopted. while a circular cross-sectional shape may be adopted for the inner end 38 of the trap hole, a rectangular cross-section as shown in FIG. 5 is appropriated for allowing off-standard small-diameter balls to pass down. A ball having an almost off-standard diameter pass through the trap hole while coming into contact with the wall surface of the inner end side 38 of the trap hole 7. With a rectangular cross-section as shown in FIG. 5 rather than a circular cross-section as shown in FIG. 6, of the inner end 38 of the trap hole 7, the contact area between the ball and the wall surface of the trap hole is smaller.

Figure 7B:
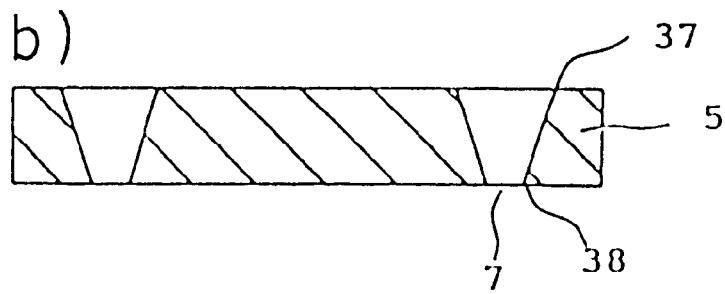

The cross-sectional shape of the trap hole 7 may be tapered as shown in FIG. 7B. In this case, the shape of the trap holes 7 is such that the sectional shape of the open end 37 thereof permits passage of a ball having the standard upper limit diameter, and the inner end 38 has such a shape that a ball having a diameter larger than the standard lower limit diameter cannot pass therethrough and a ball having a diameter smaller than this can pass therethrough. While the sectional shape may be either rectangular or circular, the rectangular shape leading to a smaller contact area between the ball and the trap hole wall surface is more favorable for ensuring smooth separation of the balls held therein.

Figure 8A:
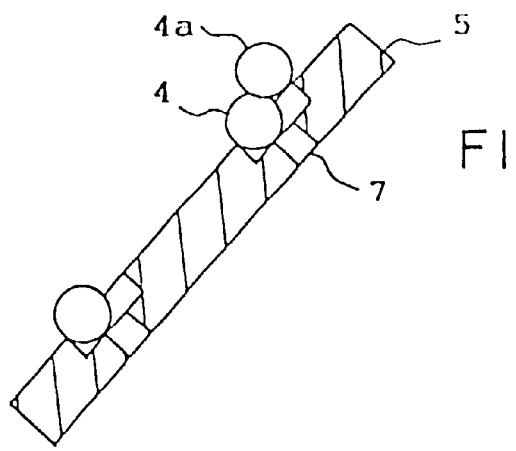
FIG. 8A is a sectional view illustrating excessive balls adhering upon pre-arrangement.
Figure 8B:
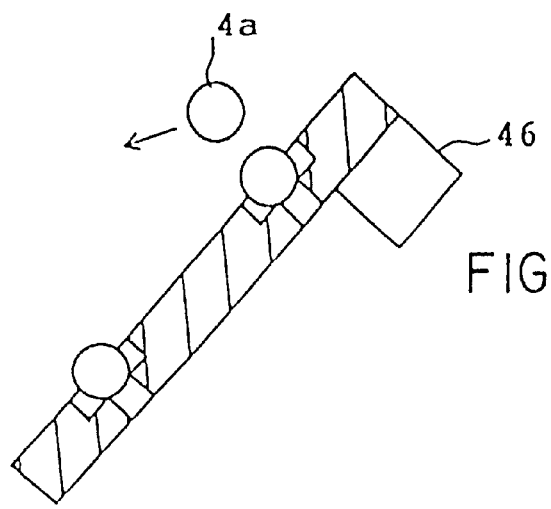
FIG. 8B is a sectional view illustrating the excessive balls removed through vibration applied by a vibrator.

In any of the method shown in FIG. 1 and that illustrated in FIG. 4A, balls 4a in excess, apart from the normal ball 4, may adhere to the trap holes 7 as shown in FIG. 8A. If the excessive balls 4a are left as they adhere, balls would adhere also to the ball arrangement device 1, and this causes a problem of transfer of the excessive balls 4a onto the mounting object 3. The vibrator 46 is brought into contact with the pre-arrangement plate 5 as shown in FIG. 8B, and the pre-arrangement plate 5 is vibrated at a timing of holding the balls 4 on the pre-arrangement plate 5. This is preferable since it becomes possible to exclude the excessive balls 4a.

Figure 8C:
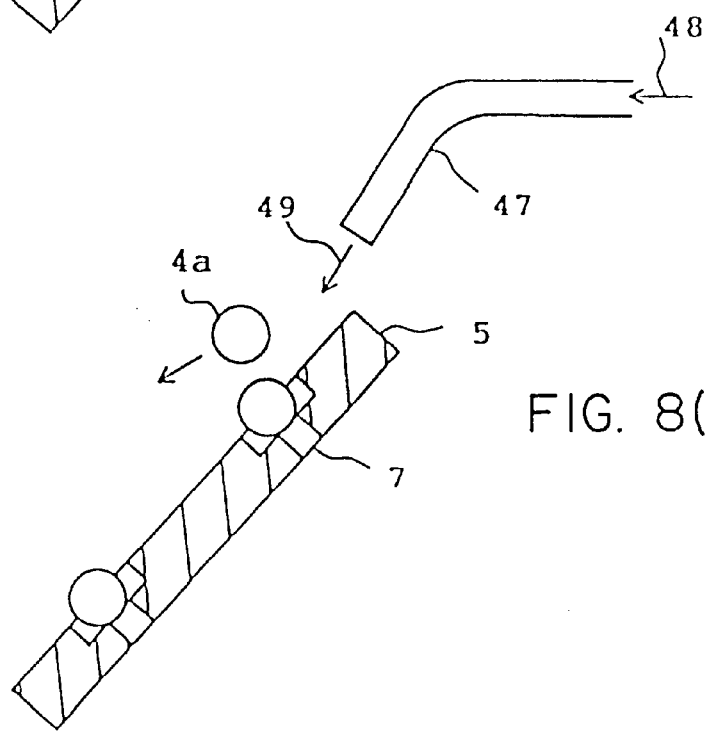
FIG. 8C is a sectional view illustrating the excessive balls removed by blowing of an air blow.

As shown in FIG. 8C, a nozzle as means for blowing a gas flow onto the surface of the pre-arrangement plate 5 is arranged, and the gas flow is blown onto the pre-arrangement plate 5 at the timing of holding the balls 4. This permits exclusion of the excessive balls 4a as well. Preferable gases for blowing include dry air and nitrogen gas.

The present invention was applied to an apparatus for mounting 400 solder balls (metal balls) having a diameter of 0.3 mm in a lump onto a mounting object. The apparatus is schematically illustrated in FIGS. 1 and 2, and an evacuation mechanism as shown in FIG. 3 was adopted for the pre-arrangement plate.

The shape as shown in FIG. 5 was adopted for the trap hole 7 of the pre-arrangement plate 5, and the pre-arrangement plate 5 was prepared by bonding a glass plate formed by piercing circular-section holes having a diameter of 0.311 mm in a photosensitive etching glass plate having a thickness of 0.20 mm, and a glass plate formed by piercing rectangular-section holes of 0.289 mm square in a photosensitive etching glass plate having a thickness of 0.50 mm. The pre-arrangement plate 5 was arranged with an inclination angle of 5° with an inclined plate 50, and solder balls were fed from a tray by means of a parts feeder. During feeding of the solder balls, pressure was reduced by connecting a vacuum pump to a pre-arrangement plate head 12 behind the pre-arrangement plate 5 to assist holding the solder balls in trap holes 7. A reservoir 36' was provided in the downstream of the inclined base 20 for collecting balls in excess. Off-standard small-diameter solder balls and fine dust passed through the trap holes 7 and were caught by a filter (not shown) provided in the pre-arrangement plate head 12.

Feeding of the solder balls was continued for four seconds, and then discontinued. During feeding the solder balls and for a while after stoppage of feeding, nitrogen gas was blow onto the pre-arrangement plate 5 by providing a nitrogen gas nozzle as means for blowing a gas as shown in FIG. 8C from diagonally above the pre-arrangement plate 5. This permits removal of excessive solder balls held in the trap holes 7. Further, a vibrator 46 shown in FIG. 8B may be provided on the pre-arrangement plate 2 for vibrating the same. Upon completion of these steps, the pre-arrangement plate 5 was horizontally rotated.

Then, as shown in FIG. 2A, the ball arrangement device 1 was moved and arranged so as to enable the ball suction holes 6 of the ball arrangement device 1 to suck the solder balls. Then, to suck the solder balls, evacuation of the trap holes 7 of the pre-arrangement plate 5 was released, and at the same time, suction 42 is carried out for evacuating the suction holes 6 of the ball arrangement device 1. A vacuum pump not shown was connected to a ball arrangement head 40. Then, the ball arrangement device 1 was separated from the pre-arrangement plate 5 while continuing suction 42 (FIG. 2B), and further, the ball arrangement device 1 was moved to a corresponding position of the mounting object to transfer the solder ball onto the mounting object 3. A flux was previously printed at positions for the transfer of the solder balls of the mounting object. The ball arrangement device 1 was lowered to the position of the mounting object 3 and was lightly pressed. Then, the vacuum system of the ball arrangement device 1 was released to lift up the ball arrangement device 1. The solder balls 4 were held on the mounting object 3 under the effect of adhering force of the flux.

As a result of 500 consecutive runs of the aforementioned arrangement operation, contamination of the ball arrangement device, or adherence of dust onto the ball suction holes was not observed at all. Off-standard small-diameter solder balls totally passed through the trap holes of the pre-arrangement plate and were excluded. In terms of the mounting object, there was achieved a success ratio of solder ball mounting was 499 runs/500 runs.

For the manufacture of the trap holes 7 of the pre-arrangement plate 5, ones manufactured by the following methods were also employed, in addition to the aforementioned method, and satisfactory results ware obtained in all cases.

(1) Piercing tapered rectangular holes of 0.311 mm square on the open end side and of 0.288 mm square on the inner end side in a photosensitive etching glass plate having a thickness of 0.500 mm;

(2) Piercing tapered rectangular holes of 0.311 mm square on the open end side and of 0.288 mm square on the inner end side as shown in FIG. 7 in a ceramic plate having a thickness of 0.600 mm; and (3) Piercing circular throughholes having a diameter of 0.289 mm and then boring with a drill a circular hole having a diameter of 0.311 mm at the same positions as the throughholes to a depth of 0.180 mm.

The best embodiment for the application of the invention for achieving the second object will now be described.

The present invention is useful particularly a method and an apparatus for forming a bump through transfer of fine balls onto a semiconductor substrate or a semiconductor chip, as a bump serving as a connecting medium between electrodes of the semiconductor chip and circuit board, or a bump for a ball grid array (BGA). In such an application, the mounting object 2 is a semiconductor substrate or a semiconductor chip to which fine balls are to be transferred, and the balls 4 are gold balls or solder balls serving as a bump. The invention is useful particularly in the application to a fine balls having a diameter within a range of from 0.04 to 0.80 mm.

Figure 9A:
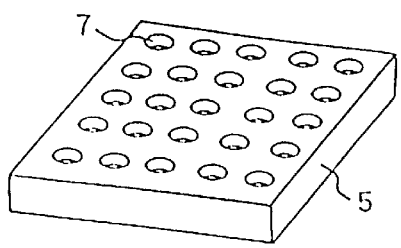
FIG. 9A is a perspective view of the pre-arrangement plate.
Figure 9D:
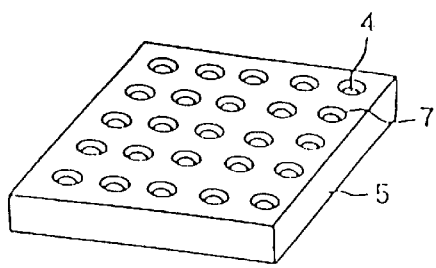
FIG. 9D is a perspective view of the pre-arrangement after the completion of pre-arrangement of the balls.
Figure 9B:
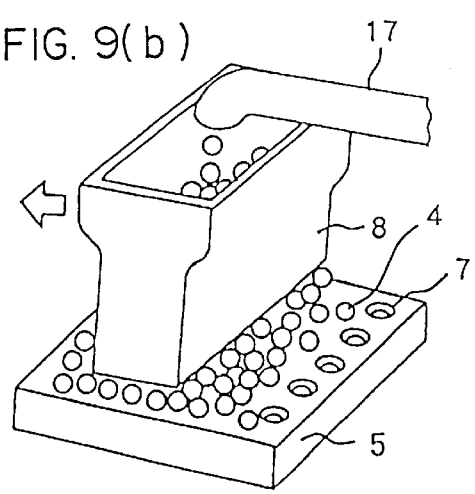
FIG. 9B is a perspective view illustrating feeding of the balls from the ball feeder to the pre-arrangement plate.
Figure 9C:
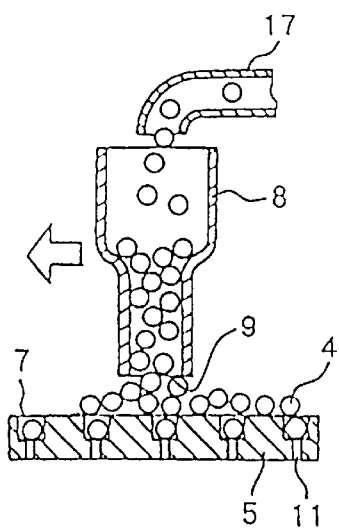
FIG. 9C is a sectional view of FIG. 9B.

The pre-arrangement plate 5 is a flat plate having trap holes 7 for the balls 4 on the surface thereof as shown in FIG. 9A. Trap holes 7 are provided at positions corresponding to ball suction holes 6 of a ball arrangement device 1. Upon pre-arranging the balls onto the pre-arrangement plate 5, the surface of the pre-arrangement plate 5 having the trap holes 7 is arranged upward, a ball feeder 8 is transversely moved on the pre-arrangement plate 5 while continuously feeding the balls 4 from the ball feeder 8. As shown in FIG. 9C, the lower end of a ball feeding port 9 at the leading end of the ball feeder is brought closer to the surface of the pre-arrangement plate 5. The balls 4 continuously fed through the ball feeding port 9 are held in the trap holes 7 on the pre-arrangement plate, and holding of the balls in many trap holes is completed in a short period of time.

Figure 9F:
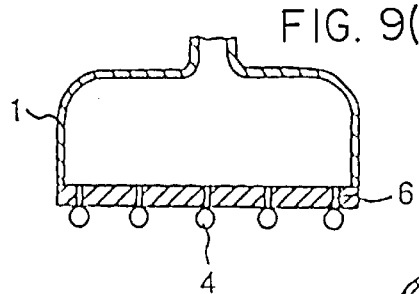
FIG. 9F is a sectional view illustrating the balls sucked to the ball arrangement device.
Figure 9E:
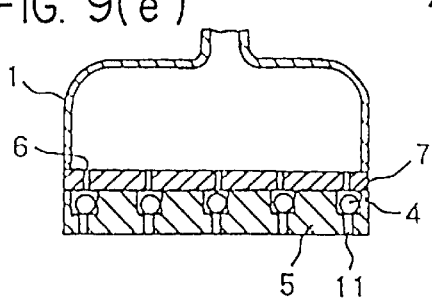
FIG. 9E is a sectional view illustrating suction of the balls from the pre-arrangement plate to the ball arrangement device.

The ball arrangement device 1 is a pad having ball suction holes 6 running therethrough on the surface as shown in FIG. 9F. The ball suction holes 6 is brought to a negative pressure by evacuating from the back, thus permitting suction of the balls 4. The ball arrangement device 1 is brought closer, as shown in FIG. 9E, to the pre-arrangement plate 5 of which holding of the balls has been completed as shown in FIG. 9D. After causing each ball suction hole 6 to face each trap hole, evacuation is carried out from the back of the ball suction holes 6 to suck the balls into the ball suction holes as shown in FIG. 9F.

Figure 9G:
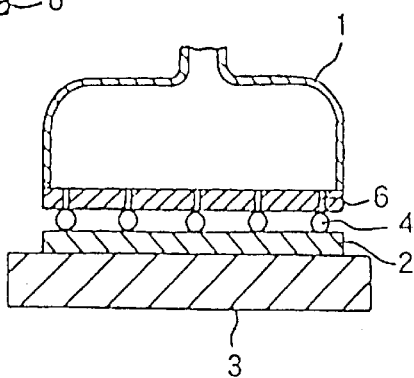
FIG. 9G is a sectional view illustrating transfer of the balls from the ball arrangement device onto the mounting object on the mounting base.

The ball suction holes 6 are arranged at positions corresponding to positions of electrodes of a semiconductor chip or the like which is the mounting object 2 onto which the balls 4 are to be transferred. As shown in FIG. 9G, the mounting object 2 is placed on a mounting base 3, and the ball arrangement device 1 holding by suction the balls in the ball suction holes in advance is brought into close contact with the mounting object 2 on the mounting base 3 to transfer the balls 4 onto the mounting object 2.

When using gold balls, the mounting object on the mounting base is previously heated, and the electrodes and the gold balls on the mounting object are thermally pressure-bonded. When using solder balls, flux is print-coated at the electrode positions in the mounting object on the mounting base, or coated onto the leading ends of the solder balls sucked in the ball arrangement device, and then transfer is carried out by bringing the solder balls into contact with the mounting object.

The lower end of the ball feeding port 9 in the ball feeder 8 should preferably have such a shape that a constant gap is maintained between the lower end and the pre-arrangement plate 5 upon feeding the balls. Further, the interval between the lower end and the pre-arrangement plate should preferably be within a range of from 1.2 to 5 times as large as the diameter of the balls. The balls fed through dropping in the ball feeder are discharged through a narrow gap between the lower end of the ball feeding port and the pre-arrangement plate. The speed is reduced in the process of discharge, ensuring that the balls are certainly held in the trap holes on the pre-arrangement plate in a short period of time. With a gap between the lower end of the ball feeding port and the pre-arrangement plate of under 1.2 times as large as the diameter of the balls, a problem may occur in which the balls clog up the gap, resulting in defective feeding. When the gap is over five times as large as the diameter of the balls, the balls, are rapidly released, resulting in an insufficient decrease in the dropping speed of the balls, and this may cause a trouble in that the balls cannot be certainly held in the trap holes.

Figure 10A:
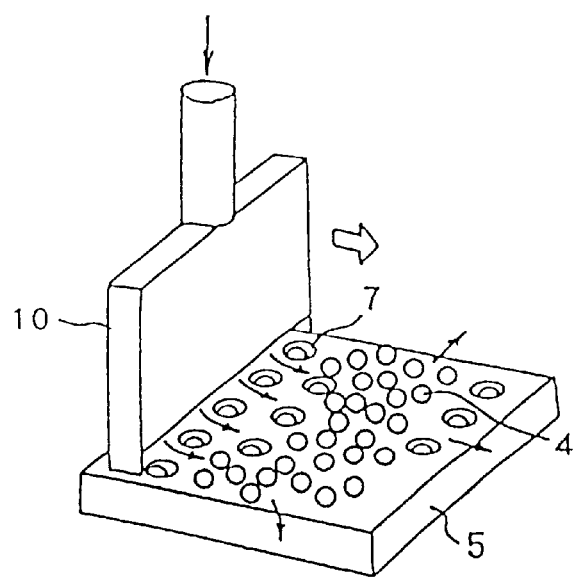
FIG. 10 covers a perspective view and a sectional view illustrating the excessive balls on the pre-arrangement plate swept out by a nozzle blowing a gas.
Figure 10B:
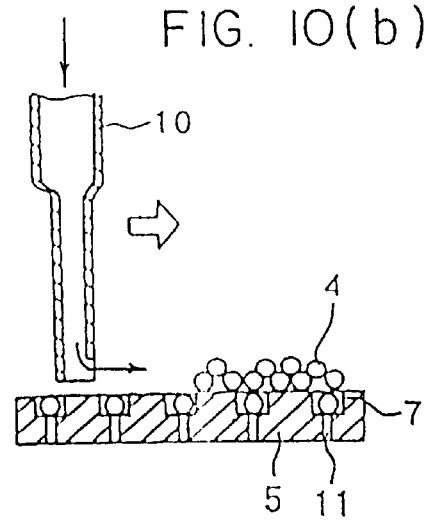

After feeding the balls by means of the ball feeder, balls in excess are present on the pre-arrangement plate. In order to certainly sweep out these excessive balls, a nozzle 10 for sweeping out the balls through gas blow on the pre-arrangement plate in arranged as shown in FIG. 10, and by transversely moving the nozzle 10 on the pre-arrangement plate, the excessive balls can be swept out from the pre-arrangement plate. As shown in FIG. 10, by using the nozzle 10 of which a gas blowing port has a width substantially equal to the width of the pre-arrangement plate, sweeping of the excessive balls can be completed through only a single run of transverse displacement of the nozzle.

The diameter of the trap hole 7 should preferably be larger than the diameter of the ball and smaller than 1.6 times as large as the diameter of the ball. When the trap hole has a diameter larger than 1.6 times the ball diameter, the trap hole already holding a ball may further constrain another ball. Since there are deviations in diameter of the balls, the diameter of the trap hole should preferably be larger than 1.1 times as large as the standard diameter of the ball. The shape of the open and of the trap hole 7 is not limited to a circular shape, but a rectangular shape may be adopted.

Figure 11A:
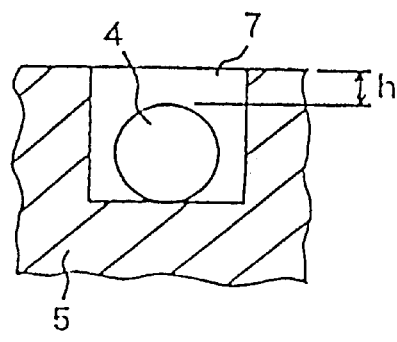
FIG. 11 covers partial sectional views illustrating the balls held in the trap holes.
Figure 11B:
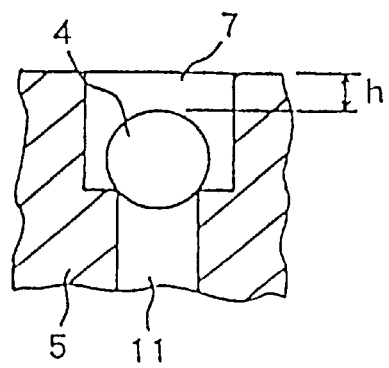

The depth of the trap hole should preferably be such that the top of a ball held in the trap hole is inner than the surface of the pre-arrangement plate and said top is at a depth up to 0.4 times the ball diameter. More specifically, the depth should preferably be such that h in FIG. 11 takes a positive value which is up to 0.4 times the ball diameter. When an external force is applied by air blow or a brush to exclude balls in excess on the pre-arrangement plate, there is no possibility that the balls held normally in the trap holes are excluded, and it is possible to bring the ball arrangement device after holding the balls in the trap holes into close contact with the pre-arrangement plate. If the value of h is over 0.4 times the ball diameter, the trap hole already holding one ball may constrain another ball.

Figure 12:
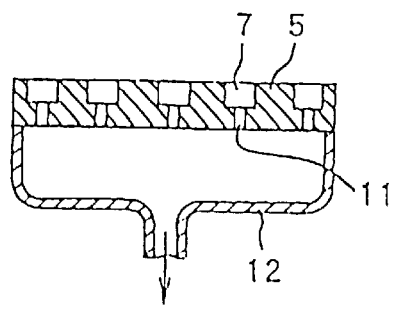
FIG. 12 is a sectional view of trap holes having through holes.

As shown in FIG. 12, there are provided throughholes 11 having a diameter smaller than ball diameter in the bottom of the trap holes 7 of the pre-arrangement plate 5, and by evacuating from below the pre-arrangement plate through the throughholes upon pre-arranging the balls in the trap holes of the pre-arrangement plate, it is possible to pre-arrange the balls more certainly. In the invention, provision of the trap holes on the pre-arrangement plate makes it possible to certainly hold the balls. Evacuation through the throughholes permits more rapid and certain holding of the balls into the trap holes upon pre-arrangement of the balls, and is useful for preventing exclusion of the held balls upon exclusion of excessive balls by virtue of air blow. The diameter of the ball suction hole of the ball arrangement device is limited to about 0.5 times the ball diameter. With a larger diameter of the ball suction hole, the pressure upon transfer onto the mounting object causes the balls to cut into the ball suction holes. However, because no such limitation is imposed in the throughholes 11 of the pre-arrangement plate 5, it is possible to select a throughhole diameter permitting display of a sucking force sufficient to suck the balls in the trap holes.

Off-standard small-diameter balls can be excluded from the pre-arrangement plate through the throughholes 11 by a sectional shape of the throughholes 11 of the pre-arrangement plate permitting passage of off-standard small-diameter balls 4. It is needless to mention that the sectional shape of the throughholes 11 should not permit passage of balls having a diameter within a specified range. More specifically, this requirement can be satisfied by using a circular sectional shape of the throughholes 11 and a diameter of the throughholes equal to the standard lower limit diameter of the balls. The sectional shape of the throughholes 11 may be rectangular, with a side length of the rectangle equal to the standard lower limit diameter of the balls. A rectangular sectional shape ensured easier passage of the balls. It is consequently possible to remove off-standard small-diameter balls and dust contained in the balls before suction into the ball arrangement device. By sucking the balls through evacuation from the throughholes, these off-standard small-diameter balls and dust can be certainly removed.

Applicable methods for feeding the balls to the ball feeder 8 include a method of feeding by the use of an inclination from a ball tray arranged at a position higher than the ball feeder, and a method of pressure-feeding the balls from the ball tray by the use of compressed air. In the invention, there can be adopted a method of using a vacuum ejector 15, sucking the balls 4 from the suction side 16 of the vacuum ejector, arranging the exhaust side 17 on the ball feeder 8 for transfer of the balls, and feeding the balls 4 onto the pre-arrangement plate 5. The vacuum ejector 15 permits suction of the balls by providing a throttle section in the middle of a pipe, and releasing a gas from a nozzle at this throttle section, thereby evacuating the back of the released flow as the "suction side" and with the direction of the released flow as the "exhaust side". By arranging the pipe end of the evacuation side 16 in the ball reservoir 14, the balls 4 are sucked into the pipe, pass through the throttle section of the vacuum ejector 15, and are exhausted on the exhaust side 17. The balls can be replenished by arranging the pipe end of the exhaust side on the ball feeder 8.

Any of various mechanical pumps and blowers is applicable as the suction unit of the balls. In a mechanical pump, however, breakage of the sucked balls at the pump portion is inevitable. The mechanical pump cannot therefore be adopted in the invention. In a vacuum ejector, in contrast, there is no mechanically operating portion, thus enabling to suck and discharge the balls without any damage.

From among the balls fed from the ball feeder 8 onto the pre-arrangement plate, balls other than those held in the trap holes are swept out as excessive balls from the pre-arrangement plate. The excessive balls thus swept out are gathered in a channel provided on at least two sides of the pre-arrangement plate. This makes it possible to quickly gather the excessive balls, and hence to send them to the ball feeder again for replenishment.

The excessive balls can be collected into the ball reservoir 14 by inclining the channel 13 for gathering the balls, and causing the balls to drop by gravity into the reservoir 14 for storing the balls. By arranging the pipe end on the suction side 16 of the vacuum ejector 15 in the reservoir 14, and the exhaust side 17 on the ball feeder 8, the excessive balls are sucked rapidly by the vacuum ejector and can be transferred to the ball feeding port 9 of the ball feeder. As a result, continuous feeding of the balls from the ball feeder can be accomplished in the invention with a compact apparatus.

After the completion of holding of the balls in the trap holes of the pre-arrangement plate, the ball arrangement device 1 is brought into close contact with the pre-arrangement plate. The individual trap holes 7 of the pre-arrangement plate and the individual ball suction holes 6 of the ball arrangement device correspond to each other in 1:1 relation ship, and the balls are sucked into the ball suction holes by evacuating through the ball suction holes 6.

Upon sucking the balls into the ball suction holes by bringing the ball arrangement device into contact with the pre-arrangement plate on which the balls are pre-arranged, evacuation is carried out from behind the ball suction holes of the ball arrangement device. During the time in which the pre-arrangement plate and the ball arrangement device are not in contact with one another, surrounding air is also sucked from the ball suction holes. A sucking force sufficient to suck the balls is not therefore fully effective. When holding by suction is to be assisted by pressurizing from the throughholes of the trap holes of the pre-arrangement plate, and a gap is present between the pre-arrangement plate and the ball arrangement device, an abnormality may occur, although in a small amount, in which the balls pressed by the pressure not sucked in the ball suction holes enter into the space between the pre-arrangement plate and the ball arrangement device.

Figures 15A, 15B:
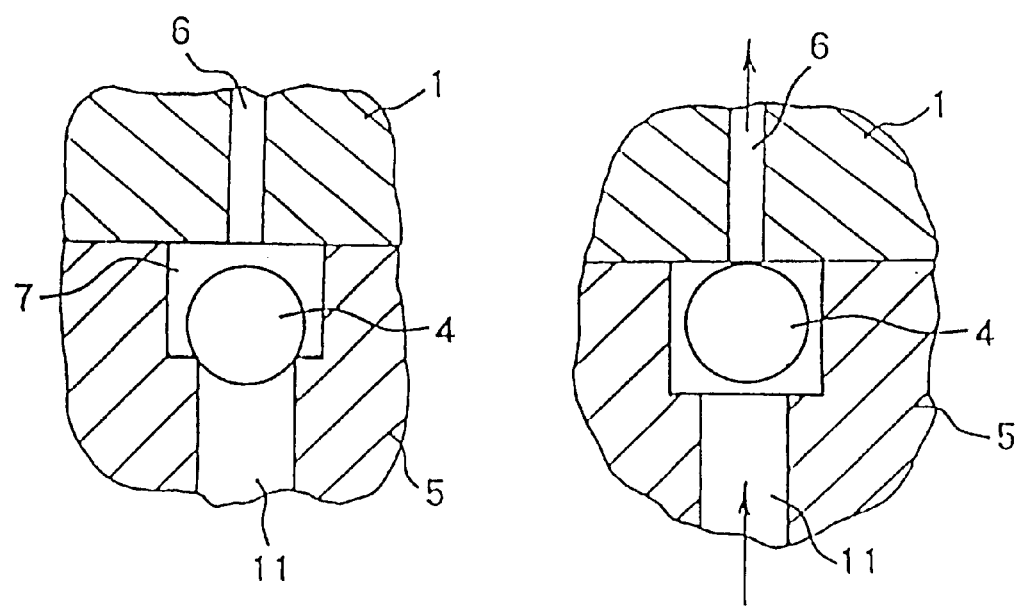
FIG. 15A is a view illustrating the close contact.
FIG. 15B is a view illustrating evacuation of the ball suction holes and application of a positive pressure to the through holes after close contact.

In the invention, as shown in FIG. 15, in which the top of the ball is closer to the inner end than the surface of the pre-arrangement plate in the trap hole 7. Upon sucking the balls pre-arranged on the pre-arrangement plate into the ball suction holes of the ball arrangement device, the aforementioned problems can be solved by bringing the ball arrangement device 1 into close contact with the pre-arrangement device 5. Because the ball arrangement device and the pre-arrangement plate are in close contact with each other, evacuation from the ball suction holes results in a negative pressure in the gap between the ball suction holes and the balls, thus permitting display of a large sucking force. It is also possible to prevent occurrence of an abnormality in which the balls jump out the trap holes.

For the reason described above, the diameter of the ball suction hole 6 is usually smaller than 0.7 times the ball diameter. The force sucking the balls is not therefore large. As a result, when a ball is attracted into the pre-arrangement plate by the attracting force between the pre-arrangement plate and the ball, balls cannot be sucked into the ball arrangement device in some cases. In the invention, in which the throughhole 11 is provided in the bottom of the trap hole 7, the portion of the ball facing the throughhole is under atmospheric pressure upon suction of the balls into the ball suction holes. Since the balls are pushed by the atmospheric pressure, suction into the suction holes 6 can be favorably accomplished. Further, by pressurizing with a positive pressure higher than the atmospheric pressure from the throughholes 11, it is possible to carry out suction of the balls more smoothly. Under a synergic effect of the sucking force of the ball suction holes and the positive pressure from the throughholes, the balls are pressed against the ball arrangement device, thus enabling to reduce cases of defective suction.

The pressure applied to the throughholes should preferably be within a range of from 0.2 to 1.5 kg/cm$^2$G. A pressure of under 0.2 kg/cm$^2$G can give only the effect similar to that available under the atmospheric pressure, and a pressure of over 1.5 kg/cm$^2$G may separate the ball arrangement device 1 from the pre-arrangement plate 5 and the balls 4 may jump out the trap holes 7 into the gap.

Electrostatic charge held by the balls 4 and the pre-arrangement plate 5 may act as an attractive force between the balls and the pre-arrangement plate, thus preventing suction of the balls into the ball arrangement device, or may act as an attractive force between the balls and the ball arrangement device, thus preventing transfer of the balls onto the mounting object 2. In the present invention, upon allying pressure as described above, it is possible to add ions to the gas for pressurizing by means of an ionizer 20. Because the gas added with ions has a function of removing electrostatic charge from the balls upon releasing the throughholes, electrostatic charge of the balls is removed, thus ensuring smooth suction and transfer of the balls by solving the aforementioned problems.

Suction of excessive balls onto the pre-arrangement plate or occurrence of defective transfer of the balls from the pre-arrangement plate to the ball arrangement device is caused by the attractive force attracting the balls to the surface of the pre-arrangement plate. This attractive force was revealed to be large when the pre-arrangement plate was a metal plate. Further, the present inventors clarified the possibility of largely reducing the attractive force of the balls by using a plastic pre-arrangement plate as the pre-arrangement plate 5. Although an accurate mechanism of the relationship between the material for the pre-arrangement plate and the attractive force is as yet unknown, the attractive force is caused by the anchor effect and the Van der Waals force, and the smaller attractive force between the metal ball and the plastic plate is considered to brings about the aforementioned effect.

Electrostatic charge is also a cause of the attractive force, and it is now possible to effectively exclude electrostatic cnarge and thus to reduce the attractive force by making the aforementioned plastic pre-arrangement plate from a conductive plastic material. In order to obtain a satisfactory effect of conductive plastics, it is necessary to add carbon graphite or the like to the plastics to achieve a conductivity as represented by a volume resistivity of about 10 MΩ·cm.

Use of a low-hardness plastics impairs durability of the pre-arrangement plate. In the invention, a practically sufficient durability of the pre-arrangement plate can be maintained by adopting a plastic material having a Rockwell hardness of at least 110-M. Plastic materials having such as hardness include PEEK (polyether-ether ketone), PI (polyimide), and PEI (polyether-ether).

After sucking the balls 4 into the ball suction holes 6 of the ball arrangement device, inspection is usually carried out for finding a ball suction abnormality prior to transferring the balls onto the mounting object 2. The inspection is generally conducted by the use of optical detecting means. For example, a method of observing the ball arrangement device from the front by means of an ITV is commonly adopted. Among others, the ball lack in which a ball is not sucked at the position at which it is to be sucked can be determined certainly by the use of an optical means. On the other hand, it is difficult by optical means using an ITV to detect an abnormality of excessive balls adhering particularly directly under normal balls.

In the arrangement of the balls using the pre-arrangement plate of the invention, occurrence of excessive balls could be almost completely eliminated, although there were observed only a few cases of ball lack. The resultant advantage is that the frequency of overlooking an abnormality in an inspection is very low even with usually adopted inspection means.

When solder balls are employed, a flux in transferred onto the transfer positions of the ball on the mounting object or onto the solder balls prior to transferring the balls onto the mounting object. If transfer is performed without noticing the presence of adhering balls in excess, a trouble may be caused in which the flux adheres to the ball arrangement device via excessive balls. In such a case, not only a single semiconductor device having an excessive ball transferred thereon becomes defective, but also the next operation cannot be started unless the ball arrangement device having adhering flux is washed, thus resulting in a seriously reduced equipment productivity.

The arrangement of the balls using the pre-arrangement plate of the invention is substantially free from occurrence of excessive balls as described above. It is thus possible to prevent a decrease in productivity caused by adherence of the flux to the ball arrangement device.

As an example, the present invention was applied to arrangement of 500 solder balls each having a diameter of 0.6 mm onto electrodes on the surface of a semiconductor substrate having a size of 30×30 mm. A ball arrangement device 1 made of a super-EMPLA plastics using PEEK was used, with a diameter of the ball suction hole 6 of 0.35 mm. The same material as that for the ball arrangement device 1 was used for the pre-arrangement plate 5. The trap hole 7 had a diameter of 0.68 mm, was a circular hole having a depth to the bottom of 0.7 mm, with a throughhole having diameter of 0.5 mm. The top of the ball held in the trap hole was positioned at a depth of 0.24 mm from the surface of the pre-arrangement plate.

A ball feeder 8 had, as shown in FIG. 9C, a ball feeding port 9 having an open end of 30 mm×5 mm at the lower end thereof, with an interval between the lower end of the ball feeding port and the pre-arrangement plate during feeding of 4 mm. It travels transversely on the pre-arrangement plate while continuously feeding the balls. Then, a nozzle 10 blowing air as shown in FIG. 10 was caused to travel transversely to sweep out excessive balls from the pre-arrangement plate. Upon feeding the balls, evacuation was carried out from behind the throughholes at the bottom of the trap holes of the pre-arrangement plate as shown in FIG. 12.

Figure 13:
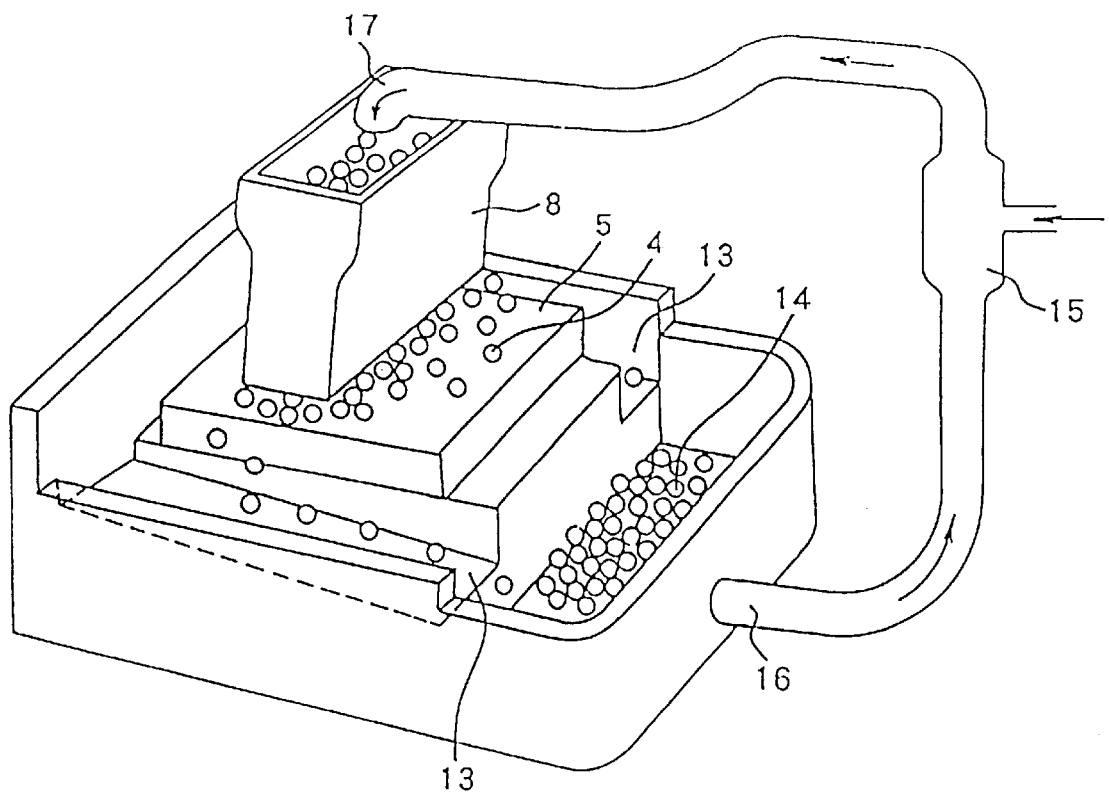
FIG. 13 is a perspective view illustrating feeding of the balls by a vacuum ejector.
Figure 14:
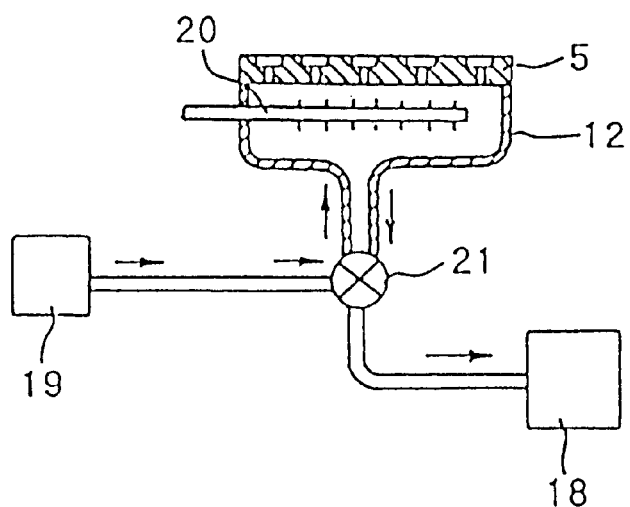
FIG. 14 is a schematic sectional view illustrating the pre-arrangement plate evacuating the trap holes and imparting a positive pressure to the trap holes.

On the both sides of the transverse travel of the ball feeder 8, channels 13 as shown in FIG. 13 for collecting excessive balls were provided, with inclined bottoms. Balls having dropped into the channels fell by gravity along this inclination, to permit collection of the balls into a ball reservoir 14. The balls collected in the reservoir were sucked by a vacuum ejector 15, and were fed to the ball feeder 8. The vacuum ejector is operated by supply of compressed air.

After pre-arrangement of the balls onto the pre-arrangement plate, the ball arrangement device 1 was brought into closed contact with the pre-arrangement plate 5 to cause the individual trap holes 7 to face the individual corresponding ball suction holes. Evacuation was carried out from behind the ball suction holes 6 of the ball arrangement device, and at the same time, the throughholes 11 at the bottoms of the trap holes of the pre-arrangement plate discontinued evacuation so far effected and started pressurization. The pressure for pressurization was 0.4 kg/cm$^2$G. Ions were added to compressed air for pressurization by means of an ionizer 20.

The mounting object 2 was a semiconductor substrate. A flux was print-coated in advance at positions where the balls were to be transferred on this semiconductor substrate. The semiconductor substrate was placed horizontally on a mounting base 3 with the surface receiving the transferred balls directed upward. The ball arrangement device having the balls sucked therein was arranged to face the semiconductor substrate, and solder balls were brought into close contact with the semiconductor substrate. Evacuation of the ball suction holes was discontinued at this point, and transfer of the balls to the semiconductor substrate was completed by pressurizing on the contrary.

Arrangement of the balls were conducted in accordance with the method of the invention. Arrangement of the balls on one pre-arrangement plate could be completed in 2.5 seconds. The occurrence ratio of a ball lack was 0.05%: all abnormality could be discovered in an inspection carried out in the middle of the process, and could be subjected to re-treatment. There was no occurrence of an excessive ball adhering abnormality.

Figure 18:
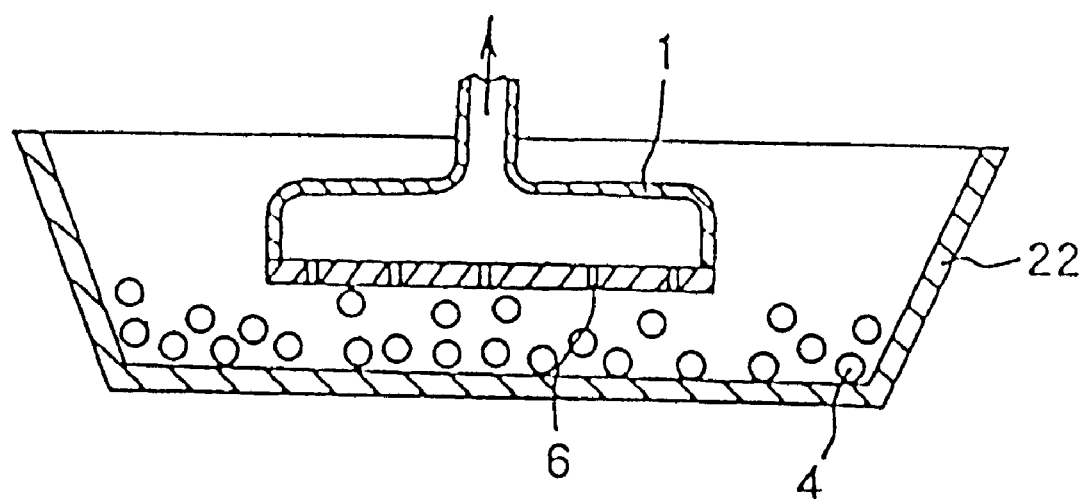
FIG. 18 is a sectional view illustrating the conventional art of sucking the balls from a ball tray onto a ball arrangement device.

As a comparative example, arrangement of transferring the same solder balls onto the same semiconductor substrate as in the present invention by a method of sucking the solder balls caused to jump by vibration in a ball tray 22 as shown in FIG. 18 into ball suction holes 6 of a ball arrangement device 1. Arrangement of the balls on a ball arrangement device took two or three seconds. Resultant arrangement abnormality occurring ratios included a ratio of 0.1% for the ball lack, and 4% for the excessive ball adhering abnormality. Among excessive ball adhering abnormality, frequency of transfer to the semiconductor substrate without detecting an abnormality actually present was 0.5%. This resulted in a rejecction of semiconductor substrate, and forced stoppage of the equipment for washing off flux adhering to the surface of the ball arrangement device.

As a second example, arrangement of balls in the same manner as in the first example except for a solder ball diameter of 0.3 mm, a ball suction hole diameter of 0.18 mm, a trap hole diameter of 0.35 mm, a depth to the bottom of 0.32 mm and a throughhole diameter of 0.28 mm. As a result, substantially the same results as in the aforementioned example were obtained in terms of the time required for arrangement and the occurring ratio of arrangement abnormality.

Another arrangement of balls was carried out by increasing the number of arranged balls from 500 in the first example to 1,000. While suction of the balls was completed in 2.5 seconds in the example of the invention as in the first example of 500 balls, the suction in the comparative example took a time of 8 to 15 seconds. In the conventional art, the suction time sharply increases according as the number of balls to be arranged increases, whereas, in the examples of the invention, no increase was observed.

The best embodiment for the implementation of the invention to achieve the third object will now be described.

The present invention is particularly useful as a method and an apparatus for forming a bump by transferring fine balls onto a semiconductor substrate or a semiconductor chip as a bump serving as a bonding medium between electrodes on a semiconductor chip and a circuit board, or as a bump for a ball grid array (BGA). In such an application, the mounting object 2 is a semiconductor substrate or a semiconductor chip to which fine balls are to be transferred, and the balls 4 are gold balls or solder balls serving as a bump.

In the ball arrangement device 1, as shown in FIG. 16, the ball suction holes 6 are throughholes provided in a pad 30. The balls 4 are sucked into the ball suction holes 6 by providing a closed room 31 on the back of the pad 30 having the throughholes, and evacuating through an evacuation route 29 provided in the closed room.

For the evacuation route 29 for evacuating the closed room 31, a cross-sectional area giving a suitable flow velocity in the route for detecting a suction abnormality is adopted with a view to measuring the flow velocity of air in the route to detect a suction abnormality of the balls. In an apparatus for arranging fine balls on a semiconductor chip or the like, it is appropriate to use an inside diameter of about 8 mm for the evacuation route 29.

Detecting means for measuring the air flow velocity is arranged in the evacuation route. For the purpose of measuring a slight change in flow velocity without causing a detrimental disturbance to the air flow in the route, use of a hot wire anemometer is most appropriate. Apart from the hot wire anemometer, a transistor type micro-wind velocity meter may be adopted. The air flow velocity in the evacuation route is previously measured for a case where evacuation is carried out from the back of the pad 30 of the ball arrangement device 1 via the evacuation route 29 by the use of evacuation means, and for a case where a ball 4 is not sucked into one or more ball suction holes 6, and a critical flow velocity for judging a ball suction abnormality is determined on the basis of this value of flow velocity. If the air flow velocity after suction of the balls is higher than this critical flow velocity, it is deemed that a suction abnormality occurs, and suction of the balls is tried again.

For the purpose of feeding the balls to be arranged on the ball arrangement device 1, the conventional method may be adopted, which comprises the steps of preparing many fine balls 4 uniform in size in a tray 22, directing the surface of the ball arrangement device 1 sucking the balls toward the fine balls in the tray and bringing the surface closer to the balls, and sucking air by evacuating ball suction holes 6 from the back of the ball suction holes 6, thereby sucking the fine balls into the ball suction holes. Sucking may more easily be accomplished by vibrating the ball tray upon sucking to cause the balls to jump in the tray, or by performing air blow through the bottom of the ball tray to cause the balls float in the tray. When adopting the method shown in FIG. 18, not only the abnormality of shortage of balls detectable by an abnormality detecting method of the invention, but also an abnormality of sucking two balls into a single ball suction hole (known as double balls), and an abnormality of excessive balls sucked at a portion other than a ball sucking hole also occur. A double-ball abnormality or an excessive ball suction abnormality cannot be detected by the detecting method of the invention. It is therefore necessary to use known means for detecting a double-ball abnormality or an excessive ball suction abnormality, in addition to the detecting means of the invention.

As another method for feeding balls to the ball arrangement device, a pre-arrangement plate 5 having trap holes 7 of balls as shown in FIG. 17 may be used. This method comprises the steps of preparing a pre-arrangement plate 5 having trap holes 7 for holding balls at positions of the ball arrangement device 1 corresponding to ball suction holes 6 (FIG. 17A), causing the trap holes 7 to hold the balls to be arranged as shown in FIG. 17B, bringing the ball arrangement plate 1 closer to the pre-arrangement plate 5 after the completion of holding of the balls as shown in FIG. 17C to cause the individual trap holes 7 to face the individual ball suction holes 6, and conducting evacuation from the back of the ball suction holes 6, thereby accomplishing suction of the balls into the ball suction holes as shown in FIG. 17D. When adopting this method, occurrence of double balls or an excessive ball suction abnormality can almost be eliminated, although there is a slight possibility of shortage of balls (some of the ball suction holes of the ball arrangement device do not suck the balls). Therefore, even if there is available only the detecting means of the invention as the detecting means of a ball suction abnormality, it is possible to detect all detrimental suction abnormalities.

When a ball suction abnormality detecting means of the invention is applied to the ball feeding method shown in FIG. 17, upon carrying out vacuum suction of the balls 4 by bringing the ball arrangement device 1 closer to the pre-arrangement plate 5, it is possible to cause the detecting means of the invention to determine completion of ball suction to the ball arrangement device, and to apply the result of this determination to the control of ball arrangement.

The ball suction holes 6 are arranged at positions corresponding to electrodes on a semiconductor chip or the like which is the mounting object 2 to which the balls 4 are to be transferred. As shown in FIG. 17E, the mounting object 2 is placed on a mounting base 3. When it is determined by the detecting means of the invention that no suction abnormality is caused, the ball arrangement device 1 is brought into close contact with the mounting object 2 on the mounting base 3, and the balls are transferred onto the mounting object 2.

When the balls are gold balls, the mounting object on the mounting base is heated in advance, and electrodes on the mounting object and the gold balls are thermally pressure-bonded. When the balls are solder balls, a flux is print-coated at electrode positions of the mounting object on the mounting base, or the flux is coated onto leading ends of the solder balls sucked to the ball arrangement device, and then, the solder balls are brought into contact with the mounting object for transfer.

When arranging fine balls on a semiconductor substrate as a bump for the semiconductor substrate, the invention was applied. Two kinds of balls having diameters of 0.6 mm and 0.3 mm were employed. Because 1,000 balls were arranged in a single run of arrangement, a ball arrangement device 1 as shown in FIG. 16 had 1,000 ball suction holes 6. Evacuation means not shown was arranged via an evacuation route 29 having an inside diameter of 8 mm as evacuating means for sucking the balls 4 into the ball suction holes 6. In this example, a COMBUM (vacuum generator using the exhaust gas flow velocity) was used as means for generating vacuum. A hot wire anemometer 28 was arranged at an inlet portion from a closed room 31 of the ball arrangement device 1 into the evacuation route 29 to measure the air flow velocity in the evacuation route 29.

The method of previously pre-arranging the balls on the pre-arrangement plate 5 as shown in FIG. 17 was adopted as the method for feeding the balls 4 to the ball arrangement device 1. The pre-arrangement plate has trap holes of the balls. After each trap hole holds a ball, the aforementioned vacuum generator was operated to evacuate the ball suction holes 6 of the ball arrangement device 1, and the balls were held by suction into the ball suction holes 6.

While the air flow velocity as measured by the hot wire anemometer 28 after starting the evacuation system and before suction was 30 m/sec, the air flow velocity after the completion of normal suction was 2 m/sec for a ball diameter of 0.6 mm, and 1.8 m/sec for a ball diameter of 0.3 mm. When one ball was intentionally omitted upon sucking the balls, the flow velocity as measured by the hot wire anemometer 28 upon completion of suction was 2.2 m/sec for a diameter of 0.6 mm and 2.0 m/sec for a diameter of 0.300 mm. It was made possible to detect the suction abnormality by adopting a critical value of air flow velocity for determining normal or abnormal of suction, on the basis of the result of measurement, of 2.1 m/sec for a diameter of 0.6 mm and 1.9 m/sec for a diameter of 0.3 mm.

As the air flow velocity in the evacuation route 29 reaches almost a constant level in 0.5 seconds after the completion of suction of the balls, the presence or absence of a suction abnormality could be determined in a short period of time as 0.6 seconds after holding by suction.

The pressure in the closed room of the ball arrangement device 1, which was 760 mmHg before starting the evacuation system, changed to 380 mmHg upon completion of suction. The pressure was reduced to only 380 mmHg upon completion of suction due to the limited capacity of the vacuum generator and leakage from the piping connections. The pressure upon completion of suction was 380 mmHg, i.e., no difference was observed between normal completion of suction and intentional omission of one ball. It is therefore clear that it is impossible to detect a ball arrangement abnormality through measurement of pressure in the closed room of the ball arrangement device.

Arrangement of the balls were repeated in the above example, and this exhibited an occurring ratio of ball lack of 0.05%. In all cases of occurrence of abnormality could be discovered by the detecting means of the invention, and could be subjected to retrial of treatment. Normal suction was never erroneously detected as an abnormality. On the other hand, in the present example, no excessive ball adhering abnormality occurred. There was therefore no problem even in this example in which no excessive ball adhering abnormality detecting means was available.

What is claimed is:

1. A method of attaching balls to an object, comprising the steps of:

moving a ball feeder, having a feeding port, across a pre-arrangement plate having a plurality of trap holes, while continuously discharging balls contained in said ball feeder through said feeding port and into said trap holes;

sucking the balls received in said trap holes onto suction holes of a ball arrangement device; and transferring the balls from said suction holes onto an object.

2. The method according to claim 1, wherein said trap holes and said suction holes are arranged in the same pattern, and further comprising, prior to the sucking step, the step of arranging said pre-arrangement plate with said ball arrangement device such that the patterns of holes correspond with one another.

3. The method according to claim 2, wherein the moving step includes maintaining a distance between the bottom of said feeding port and said pre-arrangement plate of from 1.2 to 5.0 times the diameter of the balls.

4. The method according to claim 1, and further comprising the step of moving a nozzle across said pre-arrangement plate while forcing air through said nozzle, thereby blowing air onto said pre-arrangement plate to remove excessive balls therefrom.

5. The method according to any one of claims 1 to 4, wherein said trap holes are of a diameter that is between 1.0 and 1.6 times the diameter of the balls, and are of a depth such that when the balls are received in said trap holes during the moving step a top of the balls is beneath an upper surface of said pre-arrangement plate a distance between 0.0 and 0.4 times the diameter of the balls.

6. The method according to claim 5, wherein said trap holes extend completely through said pre-arrangement plate, with said trap holes having a first portion of a first diameter and a second portion of a second diameter that is less than the first diameter.

7. The method according to claim 6, wherein the moving step results in the balls being received within said first portion of said trap holes, and further comprising the step of maintaining the balls in said first portion of said trap holes by applying a vacuum through said second portion of said trap holes.

8. The method according to claim 7, including performing the maintaining step after the blowing step.

9. The method according to claim 1, and further comprising the step of supplying balls to said ball feeder by sucking balls into a vacuum ejector, and then ejecting these balls from said vacuum ejector into said ball feeder.

10. The method according to claim 1, and further comprising the step of collecting excessive balls in channels formed on opposite sides of said pre-arrangement plate.

11. The method according to claim 10, wherein said channels are inclined, and further comprising the step of supplying balls to said ball feeder by causing the balls to travel along the inclined channels and drop into a reservoir, sucking the balls from said reservoir and into a vacuum ejector, and then ejecting these balls from said vacuum ejector into said ball feeder.

12. The method according to claim 6, wherein the sucking step includes bringing said pre-arrangement plate into contact with said ball arrangement device.

13. The method according to claim 6, wherein the moving step results in the balls being received within said first portion of said trap holes, and further comprising, simultaneously with the sucking step, the step of providing a positive pressure into said trap holes through said second portion of said trap holes.

14. The method according to claim 13, wherein the step of providing a positive pressure includes forcing an ionized gas through said second portion of said trap holes.

15. The method according to claim 14, wherein the forcing step includes flowing a gas past an ionizer.

16. The method according to claim 1, wherein the pre-arrangement plate comprises a plastic pre-arrangement plate.

17. The method according to claim 16, wherein the plastic pre-arrangement plate comprises a conductive plastic pre-arrangement plate.

18. The method according to claim 16 or 17, wherein the plastic pre-arrangement plate comprises a plastic pre-arrangement plate having a Rockwell hardness of at least 110-M.

19. The method according to claim 6, wherein during said moving step balls having a diameter between the first diameter and the second diameter are received within said first portion of said trap holes and prevented from entering said second portion of said trap holes, and balls having a diameter less than the second diameter pass through said first portion of said trap holes and through said second portion of said trap holes.

20. The method according to claim 19, wherein the balls are selected from the group consisting of solder balls and gold balls.

21. The method according to claim 20, wherein the object is selected from the group consisting of a semiconductor chip, a semiconductor-mounting substrate and a semiconductor device electrode.

22. An apparatus for attaching balls to an object, comprising:

a pre-arrangement plate having a plurality of trap holes to receive balls therein;

a ball arrangement device having a plurality ball suction holes to suck the balls received in said trap holes;

a ball feeder having a feeding port, adapted to move across said pre-arrangement plate while discharging balls through said feeder port and into said trap holes; and a support to support an object while balls are being transferred from said suction holes onto the object.

23. The apparatus according to claim 22, wherein said trap holes and said suction holes are arranged in the same pattern.

24. The apparatus according to claim 23, wherein a distance between the bottom of said feeding port and said pre-arrangement plate is from 1.2 to 5.0 times the diameter of the balls that are discharged through said feeding port and into said trap holes.

25. The apparatus according to claim 23, and further including a nozzle to blow gas onto said pre-arrangement plate while said nozzle moves across said pre-arrangement plate.

26. The apparatus according to any one of claims 23 to 25, wherein said trap holes have a diameter that is between 1.0 and 1.6 times the diameter of the balls that are received within said trap holes, and wherein said trap holes have a depth such that when the balls are received within said trap holes a top of the balls is beneath an upper surface of said pre-arrangement plate a distance between 0.0 and 0.4 times the diameter of the balls.

27. The apparatus according to claim 26, wherein said trap holes extend completely through said pre-arrangement plate and have a first portion of a first diameter and a second portion of a second diameter that is less than the first diameter.

28. The apparatus according to claim 27, and further comprising a pressure reduction device to draw air from said trap holes through said second portion of said trap holes.

29. The apparatus according to claim 22, and further comprising a reservoir to receive balls discharged through said feeding port and not received within said trap holes, and a vacuum ejector having an intake side and an exhaust side, wherein said intake side is in communication with said reservoir and said exhaust side is in communication with said ball feeder.

30. The apparatus according to claim 22, and further comprising a channel on at least two sides of said pre-arrangement plate.

31. The apparatus according to claim 30, and further comprising a reservoir and a vacuum ejector having an intake side and an exhaust side, wherein each channel is inclined toward said reservoir to allow balls discharged through said feeding port and not received within said trap holes to travel along the inclined channels and into said reservoir, and wherein said intake side is in communication with said reservoir and said exhaust side is in communication with said ball feeder.

32. The apparatus according to claim 27, and further comprising a mechanism to bring said pre-arrangement plate into contact with said ball arrangement device.

33. The apparatus according to claim 27, and further including a mechanism to provide a positive pressure into said trap holes through said second portion of said trap holes.

34. The apparatus according to claim 33, wherein said mechanism to provide the positive pressure comprises a device to force a gas through said second portion of said trap holes, and an ionizer to ionize the gas before entering said second portion of said trap holes.

35. The apparatus according to claim 22, wherein said pre-arrangement plate comprises plastic.

36. The apparatus according to claim 35, wherein said pre-arrangement plate comprises a conductive plastic.

37. The apparatus according to claim 35 or 36, wherein said pre-arrangement plate has a Rockwell hardness of at least 110-M.

38. The apparatus according to claim 27, wherein the first diameter of said first portion of said trap holes and the second diameter of said second portion of said trap holes are of such dimensions, respectively, that balls having a diameter between the first diameter and the second diameter are receivable within said first portion of said trap holes but not receivable within said second portion of said trap holes, and balls having a diameter less than the second diameter are passable through said first and second portions of said trap holes.

39. A method of attaching balls to an object, comprising the steps of:
   drawing air through suction holes of a ball arrangement device from a first end of said suction holes through a second end of said suction holes, thereby sucking balls onto said first end of said suction holes;
   determining the velocity of the air after the air has been drawn through said suction holes; and
   when the velocity is within a predetermined range, transferring said balls from said suction holes onto an object.

40. The method according to claim 39, wherein the transferring step includes transferring said balls as a group onto said object.

41. The method according to claim 40, wherein the transferring step is performed when the predetermined range of the velocity indicates that each of said suction holes has one of said balls thereon.

42. The method according to claim 41, wherein the detecting step includes detecting the velocity with a hot wire anemometer.

43. The method according to claim 42, wherein the balls are selected from the group consisting of solder balls and gold balls.

44. The method according to claim 43, wherein the object is selected from the group consisting of a semiconductor chip, a semiconductor-mounting substrate and a semiconductor device electrode.

45. An apparatus for attaching balls onto an object, comprising:
   a ball arrangement device having a plurality of suction holes each having a first end and a second end, adapted to support balls on said first end in response to air being drawn through said suction holes from said first end;
   a support to support an object while balls are being transferred from said suction holes onto the object; and
   a device to determine the velocity of the air being drawn through said suction holes, wherein the balls are not to be transferred from said suction holes until the velocity is within a predetermined range.

46. The apparatus according to claim 45, wherein the device to determine the velocity of the air includes an anemometer.

* * * * *